United States Patent
Yoshida et al.

(10) Patent No.: US 8,294,281 B2
(45) Date of Patent: Oct. 23, 2012

(54) SUPPORTING SUBSTRATE BEFORE CUTTING, SEMICONDUCTOR DEVICE, AND METHOD OF FORMING SEMICONDUCTOR DEVICE

(75) Inventors: Masanori Yoshida, Tokyo (JP); Katsumi Sugawara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/662,250

(22) Filed: Apr. 7, 2010

(65) Prior Publication Data
US 2010/0258932 A1 Oct. 14, 2010

(30) Foreign Application Priority Data
Apr. 8, 2009 (JP) ................ P2009-093955

(51) Int. Cl.
*H01L 23/52* (2006.01)
(52) U.S. Cl. ........................ 257/777; 257/787
(58) Field of Classification Search .......... 257/667, 257/686, 787, 777, 790; 438/112, 124, 126, 438/127
See application file for complete search history.

(56) References Cited

U.S. PATENT DOCUMENTS

| | | | |
|---|---|---|---|
| 7,550,857 B1 * | 6/2009 | Longo et al. | 257/777 |
| 2005/0189639 A1 * | 9/2005 | Tanie et al. | 257/686 |
| 2006/0214277 A1 | 9/2006 | Saeki | |
| 2006/0267188 A1 * | 11/2006 | Ishino et al. | 257/723 |
| 2007/0045791 A1 * | 3/2007 | Saeki | 257/668 |
| 2007/0145556 A1 * | 6/2007 | Bolken et al. | 257/678 |
| 2008/0308921 A1 * | 12/2008 | Kim | 257/686 |
| 2009/0072391 A1 * | 3/2009 | Kolan et al. | 257/737 |

FOREIGN PATENT DOCUMENTS

| | | |
|---|---|---|
| JP | 2006-269861 | 10/2006 |
| JP | 2006-319243 | 11/2006 |
| JP | 2007-66932 | 3/2007 |

\* cited by examiner

*Primary Examiner* — Fernando L Toledo
*Assistant Examiner* — Bryan Junge
(74) *Attorney, Agent, or Firm* — McGinn IP Law Group, PLLC

(57) ABSTRACT

A method of forming a semiconductor device may include, but is not limited to, the following processes. A supporting substrate is prepared. The supporting substrate has a chip mounting area, and a plurality of penetrating slits around the chip mounting area. At least a stack of semiconductor chips is formed over the chip mounting area. A first sealing member is formed, which seals the stack of semiconductor chips without the first sealing member filling the plurality of penetrating slits.

3 Claims, 10 Drawing Sheets

SUPPORTING SUBSTRATE BEFORE CUTTING, SEMICONDUCTOR DEVICE, AND METHOD OF FORMING SEMICONDUCTOR DEVICE

BACKGROUND OF THE INVENTION

1. Field of the Invention

The present invention relates to a supporting substrate before cutting, a semiconductor device, and a method of forming the semiconductor device.

Priority is claimed on Japanese Patent Application No. 2009-093955, filed Apr. 8, 2009, the content of which is incorporated herein by reference.

2. Description of the Related Art

In order to realize high speed performances, high density packaging and multi-functions of a semiconductor device, and a chip on chip technology has been studied and developed. The chip on chip will be hereinafter, referred to as CoC. In this technology, a plurality of semiconductor chips is stacked over a substrate. The stack of the semiconductor chips is packaged in a single semiconductor package at high density. The CoC technology can also be referred to as a multi-chip package technology, hereinafter, referred to as MCP.

The semiconductor device using the CoC technology, hereinafter, referred to as a CoC semiconductor device, includes a plurality of wired-connected or direct-bonded semiconductor chips. The direct-bond will hereinafter be referred to as flip chip bonding.

The CoC semiconductor device having a plurality of stacked semiconductor chips has an increased thickness. Particularly, it is preferable that a small-sized semiconductor device is integrated in a mobile device such as a mobile phone. In recent years, the requirement for higher density integration or packaging has been on the increase. Increasing the number of stacked semiconductor chips in the semiconductor device increases the total thickness of the semiconductor device, thereby making it difficult to realize the higher density packaging.

If the thickness of individual semiconductor chip is reduced in order to reduce the total thickness of the CoC semiconductor device, this will increase a stress such as a thermal stress due to difference in thermal expansion between sealing resin and the semiconductor chip. The thermal stress is caused by a thermal treatment process. The thermal stress causes a bend of the semiconductor chip so that the side portion of the semiconductor chip slightly rises up and the sectioned shape of the semiconductor chip is concave. Such bend will be called to as "concave-bend". In particular, the thermal stress is intensively applied to a position which is farthest from the substrate among the stacked semiconductor chips. This position will, hereinafter, be referred to as a top position. The largest concave-bend is generated in the top semiconductor chip which is positioned at the top position of the stack. The concave-bending will cause cracks in the semiconductor chips or the substrate.

Examples of countermeasure technique against these bending problems of the semiconductor chips are disclosed in Japanese Unexamined Patent Application, First Publications, Nos. JP-A-2006-269861, and JP-A-2007-066932.

Japanese Unexamined Patent Application, First Publications, Nos. JP-A-2006-269861 and JP-A-2007-066932 each relate to a semiconductor device and a method of forming the same. Each publication discloses a CoC semiconductor device which includes a lower substrate or a wiring board, in which a predetermined wiring is formed. The CoC semiconductor device further includes semiconductor chips which are electrically connected to the lower substrate. The CoC semiconductor device further includes an intermediate member, or a sealing member, which seals the semiconductor chips. The CoC semiconductor device further includes an upper plate which is disposed over the semiconductor chips. The thermal expansion rates of the upper plate and the lower substrate are approximately the same. By using the upper plate and the lower substrate having approximately the same thermal expansion rate, the bending of the semiconductor chip can be reduced.

The semiconductor devices disclosed in Japanese Unexamined Patent Application, First Publications, Nos. JP-A-2006-269861 and JP-A-2007-066932 are engaged with the following problems. Since the upper plate is arranged in an upper position which is distant from the stacked semiconductor chips, the thickness of the semiconductor device is increased. Since the upper plate is bonded only to the intermediate member, the intermediate member can easily be removed due to mechanical stress or mechanical shock. In addition, since the stacked semiconductor chips are sealed only by molding, voids will be generated between the semiconductor chips, to thereby lower the reliability of the semiconductor device.

Japanese Unexamined Patent Application, First Publication, No. JP-A-2006-319243 relates to a memory module and a manufacturing method thereof. This publication discloses a structure example which reinforces the CoC semiconductor device. The memory module disclosed in Japanese Unexamined Patent Application, First Publication, No. JP-A-2006-319243 is a memory module which includes a memory core chip, an interface chip and an interposer chip, and a radiator plate is provided in the vicinity of the interface chip. Further, the radiator plate is used as a support body.

Since the support body (radiator plate) is attached to the semiconductor chips only through an adhesive layer, it is likely to be detached due to mechanical damage or the like. For manufacturing the memory module, when underfill material is filled in gaps between the stacked chips, the underfill material is expanded. Accordingly, a shape, hereinafter, referred to as a fillet shape, of a portion in which the underfill material comes out of the gaps between the stacked chips is unstable. Thus, voids are generated between the stacked chips to generate cracks or the like in a reflow process, to thereby lower the reliability of the semiconductor device. In addition, in order to form an individual sealing member when manufacturing the memory module, it is necessary to prepare a mold tool for each of a plurality of chip mounting sections. Moreover, when manufacturing the memory module, in the case where the plurality of chip mounting sections is covered with the sealing member, sealing resin in a batch, thermal stress is applied to the support body, to thereby cause bend in the support body.

SUMMARY

In one embodiment, a method of forming a semiconductor device may include, but is not limited to, the following processes. A supporting substrate is prepared. The supporting substrate has a chip mounting area, and a plurality of penetrating slits around the chip mounting area. At least a stack of semiconductor chips is formed over the chip mounting area. A first sealing member is formed, which seals the stack of semiconductor chips without the first sealing member filling the plurality of penetrating slits.

In another embodiment, a semiconductor device may include, but is not limited to, a supporting substrate, a stack of semiconductor chips, a circuit board, a first sealing member, and a second sealing member. The stack of semiconductor chips is disposed over the supporting substrate. The circuit board is disposed over the stack of semiconductor chips. The stack of semiconductor chips is disposed between the supporting substrate and the circuit board. The first sealing member seals the stack of semiconductor chips. The second sealing member covers the first sealing member. The second sealing member covers a side edge of the supporting substrate.

In still another embodiment, a supporting substrate has a plurality of chip mounting areas, and a plurality of penetrating slits surroundings each of the plurality of chip mounting areas.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
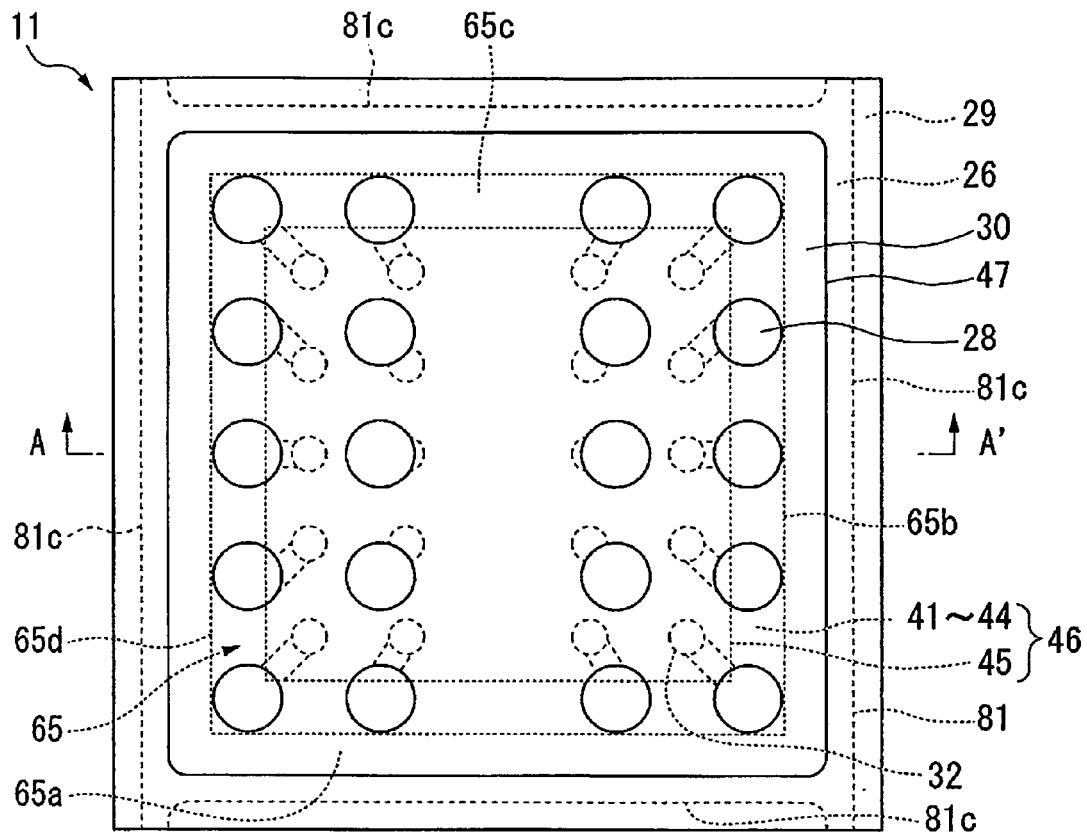
FIG. 1 is a schematic plan view illustrating a semiconductor device in accordance with a first preferred embodiment of the present invention.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a method of forming a semiconductor device may include, but is not limited to, the following processes. A supporting substrate is prepared. The supporting substrate has a chip mounting area, and a plurality of penetrating slits around the chip mounting area. At least a stack of semiconductor chips is formed over the chip mounting area. A first sealing member is formed, which seals the stack of semiconductor chips without the first sealing member filling the plurality of penetrating slits.

In some cases, the plurality of penetrating slits relaxes a thermal stress that is applied to the supporting substrate when forming the first sealing member.

In some cases, the method of forming a semiconductor device may further include, but is not limited to, forming a second sealing member that covers the first sealing member and fills the plurality of penetrating slits.

In some cases, the method of forming a semiconductor device may further include, but is not limited to, cutting the supporting substrate along the plurality of penetrating slits.

In some cases, the method of forming a semiconductor device may further include, but is not limited to, forming a circuit board on the stack after forming the second sealing member. The stack is disposed between the supporting substrate and the circuit board.

In some cases, the first sealing member is formed so that the first sealing member is defined by the plurality of penetrating slits. The supporting substrate is cut by dividing the supporting substrate into divided supporting substrates. Each of the divided supporting substrates has a side edge which is aligned to the edge of the first sealing member. The side edge is coated by the second sealing member.

In some cases, the side edge of the circuit board is in plan view positioned inside the side edge of the divided supporting substrate.

The chip mounting area may be surrounded by the plurality of penetrating slits.

In some cases, the plurality of penetrating slits may include, but is not limited to, a pair of first penetrating slits, a plurality of second penetrating slits, and a plurality of third penetrating slits. The pair of first penetrating slits extends along a pair of first opposing sides of the supporting substrate. The pair of first penetrating slits defines an area. The plurality of second penetrating slits extends within the area. The plurality of second penetrating slits defines a plurality of divided areas which are included in the area. The plurality of third penetrating slits extends within each of the plurality of divided areas. The plurality of third penetrating slits defines a plurality of sub-divided areas which are included in each of the divided areas. The sub-divided area includes the chip mounting area.

In some cases, a plurality of stacks of semiconductor chips is formed over the plurality of chip mounting areas.

In some cases, the plurality of penetrating slits further may include, but is not limited to, a plurality of fourth penetrating slits, each connecting adjacent two of the third penetrating slits.

In some cases, the plurality of penetrating slits may include at least a penetrating slit which has a locally widening portion. The locally widening portion has a generally circular shape.

In another embodiment, a semiconductor device may include, but is not limited to, a supporting substrate, a stack of semiconductor chips, a circuit board, a first sealing member, and a second sealing member. The stack of semiconductor chips is disposed over the supporting substrate. The circuit board is disposed over the stack of semiconductor chips. The stack of semiconductor chips is disposed between the supporting substrate and the circuit board. The first sealing member seals the stack of semiconductor chips. The second sealing member covers the first sealing member. The second sealing member covers a side edge of the supporting substrate.

In some cases, the side edge of the circuit board is in plan view positioned inside the side edge of the supporting substrate.

In still another embodiment, a supporting substrate has a plurality of chip mounting areas, and a plurality of penetrating slits surroundings each of the plurality of chip mounting areas.

In some cases, the plurality of penetrating slits may include, but is not limited to, a pair of first penetrating slits, a plurality of second penetrating slits, and a plurality of third penetrating slits. The pair of first penetrating slits extends along a pair of first opposing sides of the supporting substrate. The pair of first penetrating slits defines an area. The plurality of second penetrating slits extends within the area. The plurality of second penetrating slits defines a plurality of divided areas which are included in the area. The plurality of third penetrating slits extends within each of the plurality of divided areas. The plurality of third penetrating slits defines a plurality of sub-divided areas which are included in each of the divided areas. The sub-divided area includes the chip mounting area.

In some cases, the plurality of penetrating slits further may include a plurality of fourth penetrating slits, each connecting adjacent two of the third penetrating slits.

In some cases, the plurality of penetrating slits may include a penetrating slit which has a locally widening portion.

In some cases, the locally widening portion may have a generally circular shape.

Preferred embodiments of the present invention will be described.

First Embodiment

Semiconductor Device:

A semiconductor device according to a first embodiment of the present invention will be described.

Figure 2:
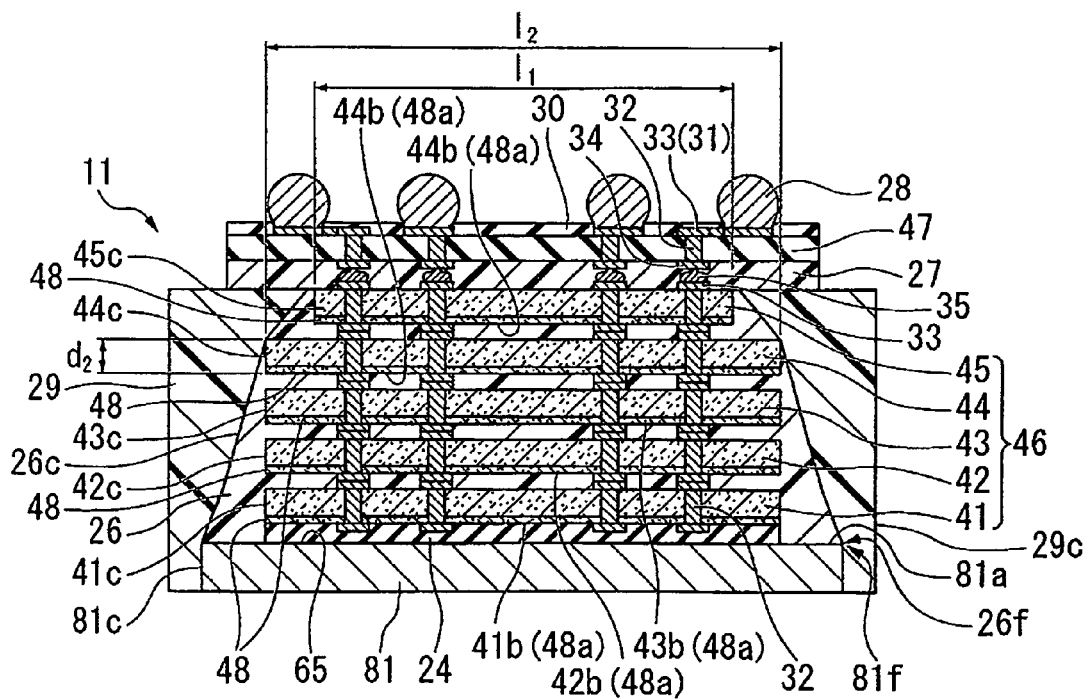
FIG. 2 is a cross sectional elevation view illustrating the semiconductor device, taken along an A-A' line of FIG. 1.

FIG. 1 is a plan view illustrating a semiconductor device according to the first embodiment of the invention. FIG. 2 is a cross sectional view illustrating the semiconductor device, taken along line A-A' in FIG. 1.

As shown in FIG. 1, a semiconductor device 11 according to the embodiment of the invention may include, but is not limited to, a wiring board 47 and an insulating film 30 on the wiring board 47. The wiring board 47 may have, but is not limited to, a rectangular shape in plan view. The semiconductor device 11 may have, but is not limited to, a matrix array of external terminals 28 on the insulating layer 30. The external terminals 28 may be, but is not limited to, a ball-shaped terminal.

Semiconductor chips 41, 42, 43, 44 and 45, hereinafter referred to semiconductor chips 41 to 45, which have a rectangular shape in plan view. The semiconductor chips 41 to 45 are smaller in area than the wiring substrate 47. The semiconductor chips 41 to 45 are arranged under the wiring substrate 47 on which the insulating film 30 is formed. The area of the semiconductor chip 45 is smaller than those of the semiconductor chips 41 to 44.

The semiconductor chips 41 to 45 have a plurality of penetration electrodes 32 having a circular shape in plan view. The plurality of penetration electrodes 32 is arranged in a lattice pattern. The plurality of penetration electrodes 32 is connected to the external terminals 28. The semiconductor chips 41 to 45 are surrounded by a first sealing member 26. The first sealing member 26 is surrounded by a second sealing member 29.

A supporting substrate 81 having a shape where an outer circumferential side thereof is partially slightly scratched is arranged.

As shown in FIG. 2, the semiconductor device 11 according to the embodiment is provided with the supporting substrate 81, a chip stacked structure 46, and the wiring substrate 47. The chip stacked structure 46 is covered with the first sealing member 26, and the first sealing member 26 is covered with the second sealing member 29.

In the chip stacked structure 46, the semiconductor chips 41 to 45 are sequentially stacked on a surface 81a of the supporting substrate 81. Accordingly, the semiconductor device 11 may be a chip on chip semiconductor device, hereinafter, referred to as CoC semiconductor device.

As shown in FIG. 2, a side surface of the chip stacked structure 46 is covered with the first sealing member 26. The first sealing member 26 has a trapezoidal shape in vertical sectioned view. The supporting substrate 81 is the base. A side surface 26c of the first sealing member 26 is an inclined surface.

The second sealing member 29 is formed to cover the first sealing member 26 and to cover a side end surface 81c of the supporting substrate 81, and the chip stacked structure 46 is firmly fixed to the supporting substrate 81.

A rectangular chip mounting section 65, on which the semiconductor chips 41 to 45 are mounted on the surface 81a of the supporting substrate 81, is provided. The side end surface 81c of the supporting substrate 81 is formed in parallel with and in the vicinity of respective sides 65a to 65d of the chip mounting section 65.

Hereinafter, the respective elements will be described.

Wiring Substrate:

The wiring substrate 47 may be a plate member which is made of insulating material and has a rectangular shape in plan view, for example, a flexible substrate, a glass epoxy substrate or the like which is formed of polyimide base material may be used.

The wiring substrate 47 may include, but is not limited to, the penetration electrodes 32 which penetrate from one surface side to the other surface side, and junction pads 33 and bonding pads 34 which are connected to the penetration electrodes 32 at one surface side and the other surface side thereof. A predetermined wiring is formed on one surface side of the wiring substrate 47. As shown in FIG. 2, the wiring may be covered with the insulating film 30 such as solder resist. Each of the bonding pads 33 which are exposed from the insulating film 30 may be electrically connected to a land 31, and the external terminal 28 which has a circular shape in vertical sectioned view is connected thereto. The lands 31 may have an interval of, for example, 0.8 mm, and are arranged on the wiring substrate 47 in a lattice pattern in plan view. The thickness of the wiring substrate 47 is not particularly limited, but may be, for example, 100 μm.

Supporting Substrate:

The supporting substrate 81 may be, but is not limited to, a plate-shaped member made of metallic material. For example, high stiffness material such as alloy 42 which is an iron nickel alloy may be preferably used as the metallic material. Accordingly, even though the thickness of the semiconductor device is thin, bend of the semiconductor chips due to thermal stress can be prevented, and cracks of the semiconductor chips can be prevented.

The thickness of the supporting substrate 81 is not particularly limited, but may be, for example, 100 μm to 200 μm.

As the supporting substrate 81, material having high thermal radiation characteristics such as Cu may be used. Accordingly, a semiconductor device of high thermal radiation characteristics can be achieved.

Chip Stacked Structure:

As shown in FIG. 2, the chip stacked structure 46 is formed by sequentially stacking the semiconductor chips 41 to 45 on the surface 81a of the supporting substrate 81 through a first adhesive member 24.

First Adhesive Member:

The chip stacked structure 46 adheres to the supporting substrate 81 due to the first adhesive member 24. It is preferable to use high insulating material as the first adhesive member 24. By using the high insulating material, the semiconductor chip 41 and the supporting substrate 81 may be in an insulated state. Further, it is more preferable to use material having high thermal conductivity. Accordingly, heat from the chip stacked structure 46 is effectively transferred to the supporting substrate 81, to thereby improve thermal radiation characteristics of the semiconductor device.

As the first adhesive member 24, for example, a die attached film, hereinafter referred to as DAF, a non conductive paste, hereinafter, referred to as NCP, or the like which is made by forming an adhesive layer on opposite sides of a polyimide base material may be used.

Semiconductor Chips:

Circuit forming layers 48 which are formed of an oxide film or the like are formed on a surface 41b of the semiconductor chip 41, a surface 42b of the semiconductor chip 42, a surface 43b of the semiconductor chip 43, a surface 44b of the semiconductor chip 44, and a surface 45b of the semiconductor chip 45, which perform as circuit forming surfaces 48a.

Dynamic Random Access Memories, hereinafter referred to as DRAM are formed on the circuit forming layers 48 of the semiconductor chips 41 to 44, and accordingly, the semiconductor chips 41 to 44 are DRAM core chips which are used for storing information.

Further, an interface, hereinafter referred to as IF, circuit is formed on the circuit forming layer 48 of the semiconductor chip 45, and the semiconductor chip 45 is an IF chip which is used for controlling input and output of data of the semiconductor chips 41 to 44.

The semiconductor chips 41 to 45 are stacked in the state that the circuit forming surfaces 48a are faced down toward an opposite side to the wiring substrate 47. Thus, a semiconductor chip having a single circuit forming layer 48 may be prepared as the DRAM core chip. Since it is not necessary to prepare a mirror chip in which bump electrodes or the like are reversely arranged as a DRAM core chip, the manufacturing cost of the semiconductor device may be reduced.

Each of the semiconductor chips 41 to 45 may include, but is not limited to, the penetration electrodes 32 which penetrate from one surface side to the other surface side, and the bonding pads 33 and the bonding pads 34 which are connected to the penetration electrodes 32 at one surface side and the other surface side thereof.

The semiconductor chips 41 to 45 are spaced from each other, and the bonding pads 33 of one surface side and the bonding pads 34 of the other surface side are connected to each other and stacked between the semiconductor chips 41 to 45.

In addition, the semiconductor chip 45 and the wiring substrate 47 are spaced from each other. The bonding pads 33 of one surface side of the wiring substrate 47 are connected to the bonding pads 34 of the other surface side of the semiconductor chip 45 through wire stand bumps 35, hereinafter referred to as wire bumps, which are made of Au. Further, the external terminal 28 has a circular shape in vertical sectioned view. The external terminal 28 is connected on the land 31 of the wiring substrate 47.

The bonding pads 33 of one surface side of the first semiconductor chip 41 are connected to the bonding pads 34 of the other surface side of the second semiconductor chip 42. The bonding pads 33 of one surface side of the second semiconductor chip 42 are connected to the bonding pads 34 of the other surface side of the third semiconductor chip 43. The bonding pads 33 of one surface side of the third semiconductor chip 43 are connected to the bonding pads 34 of the other surface side of the fourth semiconductor chip 44. The bonding pads 33 of one surface side of the fourth semiconductor chip 44 are connected to the bonding pads 34 of the other surface side of the fifth semiconductor chip 45. The bonding pads 34 of the other surface side of the wiring substrate 47 are connected to the bonding pads 33 of one surface side of the semiconductor chip 45 through the wire bumps 35.

Instead of the wire bumps 35, solder bumps may be used.

As described above, the bonding pads 33 of one surface side of each of the semiconductor chips 41 to 45 and the bonding pads 34 of the other surface side thereof are connected to each other. Conduction can be secured from the external terminal 28, which is connected to the bonding pads 33 connected to the lands 31 of one surface side of the wiring substrate 47, to the bonding pads 34 of the other surface side of the first semiconductor chip 41.

As shown in FIG. 2, the chip stacked structure 46 is formed by stacking the semiconductor chips 41 to 45. By stacking the semiconductor chips 41 to 45, a high density semiconductor device can be achieved.

The plate thickness of the semiconductor chips 41 to 45 is preferably thinner than the thickness of a single semiconductor chip configuration in the related art. Accordingly, more semiconductor chips may be stacked to thereby manufacture a thin semiconductor device of high density.

The plate thickness $d_2$ of the semiconductor chips 41 to 45 is, for example, 30 μm to 50 μm.

The semiconductor chip 45 having a width $l_1$ narrower than a width $l_2$ of the semiconductor chips 41 to 44 is arranged on a side of the chip stacked structure 46 which is directed to the wiring substrate 47, that is, on a side which is opposite to the supporting substrate 81.

The side of the chip stacked structure 46 which is directed to the wiring substrate 47, that is, a location opposite to the supporting substrate 81 is a location where maximum thermal stress is applied when the first sealing member 26 is thermally expanded or contracted. Thus, the semiconductor chip 45 having the width $l_1$ shorter than the width $l_2$ of the semiconductor chips 41 to 44 is arranged in this location, and thus, a resistance characteristic against bend due to the thermal stress of the chip stacked structure 46 is reinforced to thereby prevent the semiconductor chip 11 from being cracked.

Further, as the circuit forming surface 48a of the semiconductor chip 45 is directed to the other semiconductor chips 41 to 44, a force to contract the circuit forming surface 48a, hereinafter convex-bending force, is generated in the semiconductor chip 45 when the thermal stress is applied thereto. The concave-bend due to the thermal stress is reduced. Accordingly, even though the thickness of the semiconductor device 11 becomes thin, cracks in the semiconductor chip 11 may be prevented.

The number of the semiconductor chips which form the chip stacked structure 46 is not particularly limited, and may be 2 or more. Further, the configuration of the semiconductor chips is not limited to the four memory core chips and the single IF chip as described in this embodiment, and may include a combination of semiconductor chips having any function such as a combination of a memory chip and a logic chip.

Second Adhesive Member:

The wiring substrate 47 adheres to the chip stacked structure 46 by a second adhesive member 27.

It is preferable to use insulating material as the second adhesive member 27. Accordingly, a gap between the semiconductor chip 45 and the wiring substrate 47 in an insulation state may protect, from mechanical and electrical damage, electric junction sections which are formed of the bonding pads 33 of one surface side of the wiring substrate 47, the bonding pads 34 of the other surface side of the semiconductor chip 45, and the wire bumps 35.

Similar to the first junction member 24, for example, NCP or the like may be used as the second junction member 27.

First Sealing Member:

As shown in FIG. 2, the first sealing member 26 fills gaps between the semiconductor chips 41 to 45, and covers side surfaces 41c, 42c, 43c, 44c and 45c, hereinafter, referred to as side surfaces 41c to 45c of the semiconductor chips 41 to 45, respectively.

Forming the first sealing member 26 to fill the gaps between the semiconductor chips 41 to 45 protects junction sections, hereinafter, referred to as electric junction sections, of the bonding pads 33 of one surface side and the bonding pads 34 of the other surface side which are connected to each other, respectively, between the semiconductor chips 41 to 45.

In addition, part of an outermost edge part 26f of the first sealing member 26 is in a location of being overlapped with an outer edge part 81f of the supporting substrate 81. The first sealing member 26 has a trapezoidal shape in vertical sectioned view. The supporting substrate 81 is the base. The side surface 26c of the first sealing member 26 is an inclined surface. The first sealing member 26 is formed to have the trapezoidal shape in vertical sectioned view in which the side of the supporting substrate 81 becomes the lower base. Adhesion between the first sealing member 26 and the supporting substrate 81 is enhanced to prevent removal of the supporting substrate 81. As the surface 81a of the supporting substrate 81 is irregular, adhesion between the supporting substrate 81 and the first sealing member 26 may be further enhanced.

As the first sealing member 26, for example, underfill material is used.

It is preferable that the side surfaces 41c to 45c of the semiconductor chips 41 to 45 and the side end surface 81c of the supporting substrate 81 are closer to each other in distance. As the side surface 41c of the semiconductor chip 41 and the side end surface 81c of the supporting substrate 81 are closer to each other in distance, the side end surface 81c of the supporting substrate 81 may restrict expansion of the first sealing member 26. The first sealing member 26 may be stabilized in a fillet shape having a trapezoidal shape in vertical sectioned view.

Second Sealing Member:

As shown in FIG. 2, the side end surface 81c of the supporting substrate 81 is arranged further inside a side end surface 29c of the second sealing member 29. Further, the second sealing member 29 is formed to cover the first sealing member 26 and to cover at least part of the side end surface 81c of the supporting substrate 81. The chip stacked structure 46 is firmly fixed to the supporting substrate 81. As the side end surface 81c of the supporting substrate 81 is covered by the second sealing member 29, adhesion between the second sealing member 29 and the supporting substrate 81 may be enhanced and removal of the supporting substrate 81 may be restricted.

As the second sealing member 29, for example, sealing resin such as epoxy resin may be used.

Supporting Substrate before Cutting:

A supporting substrate before cutting which is used in a method of forming a semiconductor device according to an embodiment of the invention will be described hereinafter.

Figure 3:
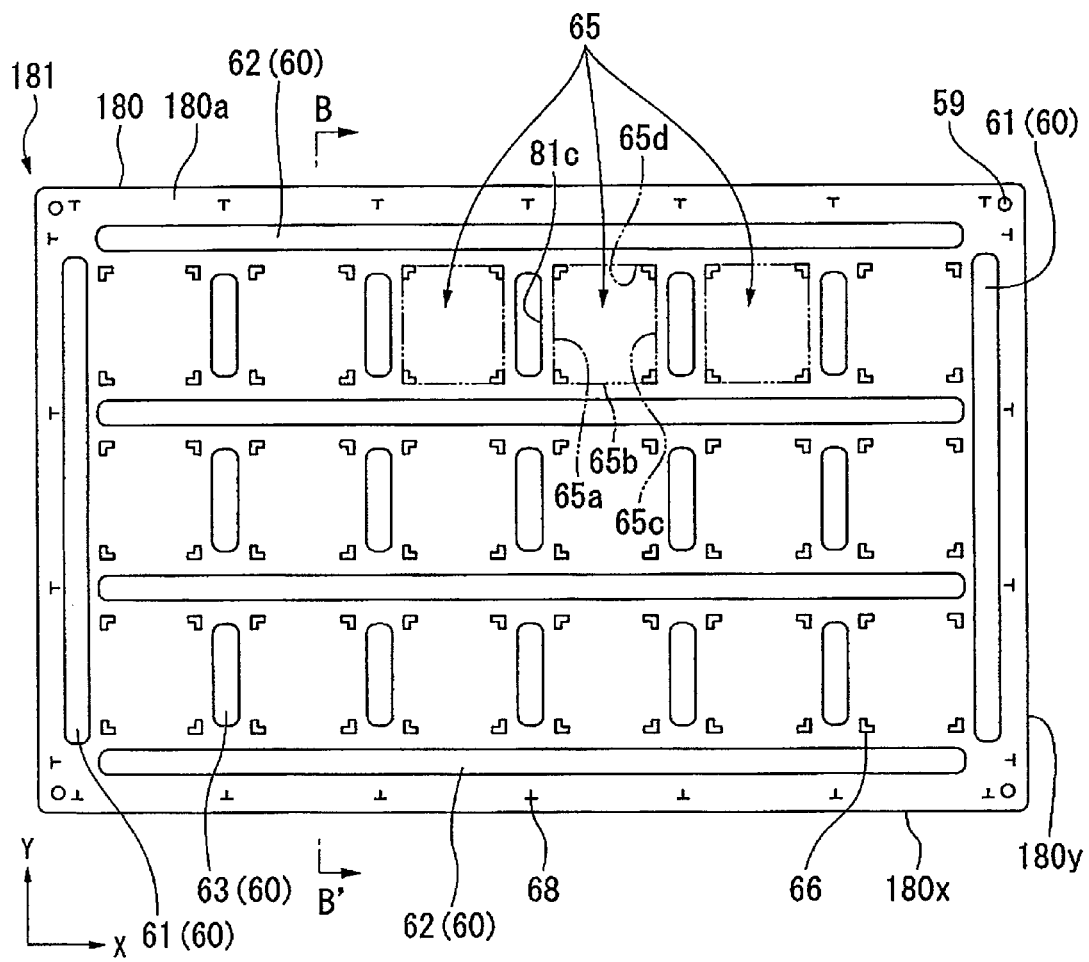
FIG. 3 is a plan view illustrating a supporting substrate before cutting which is used in a method of forming the semiconductor device of FIGS. 1 and 2.
Figure 4:
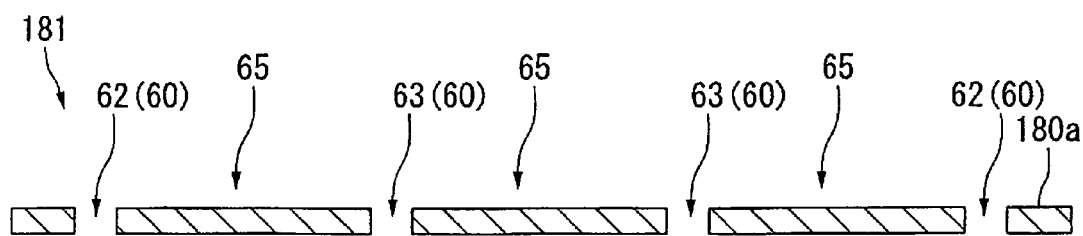
FIG. 4 is a cross sectional elevation view illustrating the supporting substrate before cutting, taken along a B-B' line of FIG. 3, in a step involved in a method of forming the semiconductor device of FIGS. 1 and 2.

FIG. 3 is a plan view illustrating an example of the supporting substrate before cutting according to the embodiment of the invention. FIG. 4 is a sectional view illustrating a supporting substrate 181 before cutting taken along line B-B' in FIG. 3.

As shown in FIG. 3, the supporting substrate 181 before cutting is formed of a substrate main body 180 having a rectangular shape which has long horizontal sides and is processed by a Mold Array Process (MAP) method. The substrate main body 180 is formed of metallic material such as alloy 42 which is an iron nickel alloy of a thickness of 0.1 mm. A direction which is in parallel with a side 180y of the substrate main body 180 of the supporting substrate 181 before cutting shown in FIG. 3 is represented as a Y direction. A direction which is in parallel with the other side 180x is represented as an X direction.

As shown in FIG. 3, on one side 180a of the substrate main body 180, two or more penetration slits 60 which are in parallel with the X direction and Y direction are formed in a lattice pattern in plan view. Two or more rectangular chip mounting sections 65 on which the semiconductor chips are mounted are disposed in a lattice pattern in plan view due to these penetration slits 60. Accordingly, two or more penetration slits 60 are formed so as to surround the chip mounting section 65. The supporting substrate 181 before cutting is cut along the penetration slits 60 to form the supporting substrate 81.

Positioning holes 59 are formed in four corners of the supporting substrate 181 before cutting. Due to the positioning holes 59, positioning may be correctly performed and the supporting substrate 181 before cutting may be easily transported.

As shown in FIG. 3, the penetration slits 60 include first penetration slits 61 which are formed along the side 180y of the substrate main body 180 and the opposite side thereof, second penetration slits 62 which are formed in a region which is disposed between the first penetration slits 61 and are perpendicular to the first penetration slits 61, and third penetration slits 63 which are formed in a region which is disposed between the second penetration slits 62 and are perpendicular to the second penetration slits 62.

The approximately rectangular chip mounting sections 65 which are partitioned by chip mounting marks 66 are disposed in a region which is surrounded by the penetration slits 60. Further, as shown in FIG. 4, the chip mounting sections 65 are formed on one surface 180a of the substrate main body 180 of the supporting substrate 181 before cutting, and are partitioned by the third penetration slits 63. The semiconductor chip 41 having approximately the same size as each chip mounting section 65 is arranged in the chip mounting section 65.

The penetration slits 60 are disposed so that their lengthwise direction is in parallel with respective sides 65a to 65d of the adjacent chip mounting sections 65.

Further, the penetration slits 60 are disposed to be close to the respective sides 65a to 65d of the adjacent chip mounting sections 65. Accordingly, in a manufacturing process which will be described later, the penetration slits 60 restrict expansion of the first sealing member (underfill material) 26 to thereby obtain a desired fillet shape.

The first penetration slit 61 has approximately the same length as that of one side 180y of the substrate main body 180 of the supporting substrate 181 before cutting. Further, the second penetration slit 62 has approximately the same length as that of the other side 180x of the substrate main body 180 of the supporting substrate 181 before cutting. In this way, the penetration slits 60 are preferably formed as long as possible, so as to correspond to the plurality of chip mounting sections. Accordingly, in the later described manufacturing process, when the first sealing member 26 is thermally expanded or contracted, thermal stress applied to the chip amounting sections 65 becomes further reduced.

Cutting marks 68 indicating virtual dicing lines are formed in an outer circumferential side of the supporting substrate 181 before cutting. As the cutting marks 68 are formed in the outer circumferential side of the supporting substrate 181 before cutting, even though a center region of the supporting substrate 181 before cutting is sealed and a location of the chip stacked structure is in an invisible state, by performing cutting along the dicing lines using the cutting marks 68, and thus, a semiconductor device of an exact size can be manufactured.

Method of Forming Semiconductor Device:

A method of forming a semiconductor device according to an embodiment of the invention will be described with reference to FIGS. 5 to 17.

The method of forming the semiconductor device according to the embodiment of the invention includes the following processes. Two or more semiconductor chips are stacked on one surface of the supporting substrate before cutting. This process will be hereinafter referred to as stacking process. The first sealing member is formed to cover the side surfaces of the semiconductor chips, and then the second sealing member is formed to cover the first sealing member. These processes will be hereinafter referred to as sealing processes. The supporting substrate before cutting is cut along the penetration slits to obtain the supporting substrate. This process will be hereinafter referred to as a dicing process.

Stacking Process:

The first adhesive member 24 such as DAF, NCP is adhered and fixed to the chip mounting section 65 which is disposed on the surface 180a of the substrate main body 180 of the supporting substrate 181 before cutting.

Figure 5:
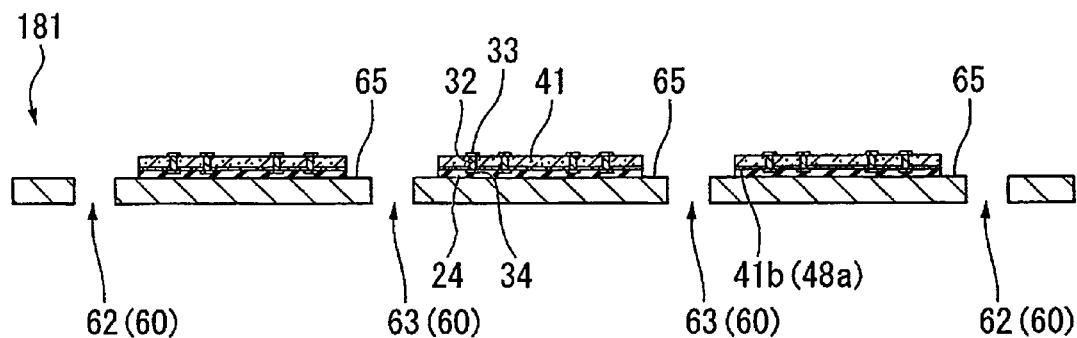
FIG. 5 is a cross sectional elevation view illustrating the semiconductor device, taken along an A-A' line of FIG. 1, in a step, subsequent to the step of FIG. 4, involved in a method of forming the semiconductor device of FIGS. 1 and 2.

As shown in FIG. 5, the circuit forming surface 48a of the semiconductor chip 41 is faced down so that the circuit forming surface 48a is directed to the supporting substrate 181 before cutting. The semiconductor chip 41 is mounted on the first adhesive member 24 of each chip mounting section 65 of the supporting substrate 181 before cutting.

The circuit forming surface 48a of the semiconductor chip 42 is in the face down direction. The semiconductor chip 42 is mounted on the semiconductor chip 41.

At this time, the bonding pads 33 of one surface side of the semiconductor chip 41 and the bonding pads 34 of the other surface side of the semiconductor chip 42 are connected to each other and are temporarily fixed at a low temperature of about 150° C.

The circuit forming surface 48a of the semiconductor chip 43 is in the face down direction. The semiconductor chip 43 is mounted on the semiconductor chip 42.

At this time, the bonding pads 33 of one surface side of the semiconductor chip 42 and the bonding pads 34 of the other surface side of the semiconductor chip 43 are connected to each other and are temporarily fixed at a low temperature of about 150° C.

Figure 6:
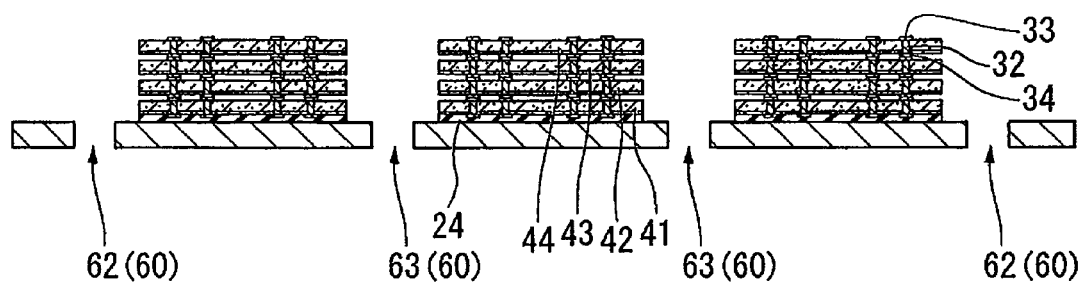
FIG. 6 is a cross sectional elevation view illustrating the semiconductor device, taken along an A-A' line of FIG. 1, in a step, subsequent to the step of FIG. 5, involved in a method of forming the semiconductor device of FIGS. 1 and 2.

As shown in FIG. 6, the circuit forming surface 48a of the semiconductor chip 44 is in the face down direction. The semiconductor chip 44 is mounted on the semiconductor chip 43.

At this time, the bonding pads 33 of one surface side of the semiconductor chip 43 and the bonding pads 34 of the other surface side of the semiconductor chip 44 are connected to each other and are temporarily fixed at a low temperature of about 150° C.

Figure 7:
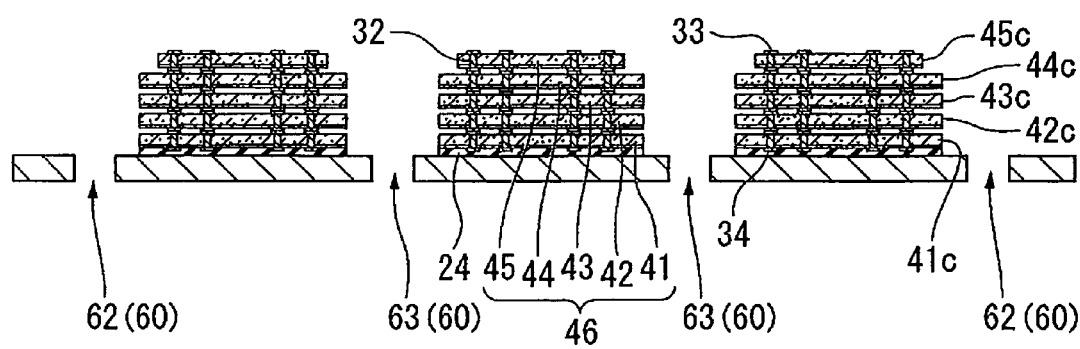
FIG. 7 is a cross sectional elevation view illustrating the semiconductor device, taken along an A-A' line of FIG. 1, in a step, subsequent to the step of FIG. 6, involved in a method of forming the semiconductor device of FIGS. 1 and 2.

As shown in FIG. 7, the circuit forming surface 48a of the semiconductor chip 45 is in the face down direction. The semiconductor chip 45 is mounted on the semiconductor chip 44.

At this time, the bonding pads 33 of one surface side of the semiconductor chip 44 and the bonding pads 34 of the other surface side of the semiconductor chip 45 are connected to each other and are temporarily fixed at a low temperature of about 150° C.

At a high temperature of about 300° C., load is applied to the semiconductor chips 41 to 45 toward the supporting substrate 181 before cutting, and thus, each bonding pads 33 of one surface side and each bonding pads 34 of the other surface side of the semiconductor chips 41 to 45 are actually pressure-connected. Accordingly, conduction is secured from the bonding pads 34 of the semiconductor chip 41 to the bonding pads 33 of the fifth semiconductor chip 45. The chip stacked structure 46 made of the semiconductor chips 41 to 45 is formed.

When connecting the semiconductor chips 41 to 45, load may be applied thereto and at the same time ultrasound waves may be applied thereto. Thus, a junction with improvement firmness may be obtained.

Further, the actual pressure-connection may be performed in each junction stage without performing the temporary fixing.

Sealing Process:

The first sealing member 26 is supplied in a drop-down manner to the side surface of the chip stacked structure 46 which is formed on the supporting substrate 181 before cutting. At this time, the first sealing member 26 is filled in gaps between the semiconductor chips 41 to 45 due to a capillary tube phenomenon and flows down toward the supporting substrate 181 before cutting due to gravity.

Figure 8:
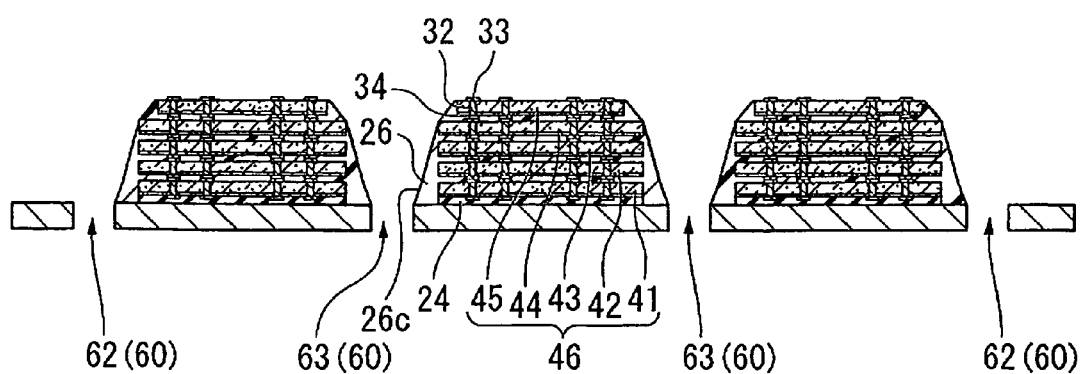
FIG. 8 is a cross sectional elevation view illustrating the semiconductor device, taken along an A-A' line of FIG. 1, in a step, subsequent to the step of FIG. 7, involved in a method of forming the semiconductor device of FIGS. 1 and 2.

As shown in FIG. 8, the first sealing member 26 is cured by performing a thermal process (curing) at about 150° C. Thus, the first sealing member 26 is formed. The first sealing member 26 covers the side surfaces 41c to 45c of the semiconductor chips 41 to 45. The first sealing member 26 has a trapezoidal shape in vertical sectioned view. The supporting substrate 181 before cutting is the base. The side surface 26c of the first sealing member 26 is an inclined surface.

In a cooling process after the thermal curing, the thermal expansion and contraction of the first sealing member 26 is larger than that of the semiconductor chips 41 to 45. Thermal stress to cause concave-band is applied to the chip stacked structure 46 due to the first sealing member 26. In particular, the chip stacked structure 46 is fixed to the supporting substrate 181 before cutting. Thermal stress of the bend in the lowest position of the chip stacked structure 46 is restricted. The thermal stress to cause the concave-bend bend is applied to the respective layers of the chip stacked structure 46. The strongest thermal stress to cause the concave-bend bend is applied to the uppermost semiconductor chip 45.

In this embodiment, the semiconductor chip 45 having the width $l_1$ shorter than the width $l_2$ of the semiconductor chips 41 to 44 is arranged on the top of the chip stacked structure 46. The concave-bend due to the thermal stress is restricted. The semiconductor chips are prevented from being cracked.

In the cooling process after the thermal curing, thermal expansion and contraction of an oxide film for forming the circuit forming surface 48a is larger than that of the semiconductor chips 41 to 45. Contraction thermal stress is applied to the circuit forming surface 48a.

In this embodiment, the circuit forming surface 48a of the semiconductor chip 41 is arranged in the face down direction. Thermal stress which causes convex-bent is applied to the semiconductor chip 41. Due to thermal stress which causes convex-bent, the thermal stress to cause concave-bent due to the thermal stress of the first sealing member 26 may be offset to thereby reduce the thermal stress.

The penetration slits 60 are formed in parallel with or in the vicinity of the respective sides 65a to 65d of the chip mounting sections 65 of the supporting substrate 181 before cutting. Thermal stress is reduced which is applied to the semiconductor chips 41 to 45 and the supporting substrate 181 before cutting by the first sealing member 26.

The penetration slit 60 restricts expansion of the first sealing member 26 like a dam. A fillet shape of the first sealing member 26 is stabilized.

The supporting substrate 181 before cutting, in which the first sealing member 26 is formed, is arranged on a lower shaping mold 71, hereinafter referred to as lower mold, of a transfer mold apparatus so that the other surface 180b becomes a lower side.

Figure 9:
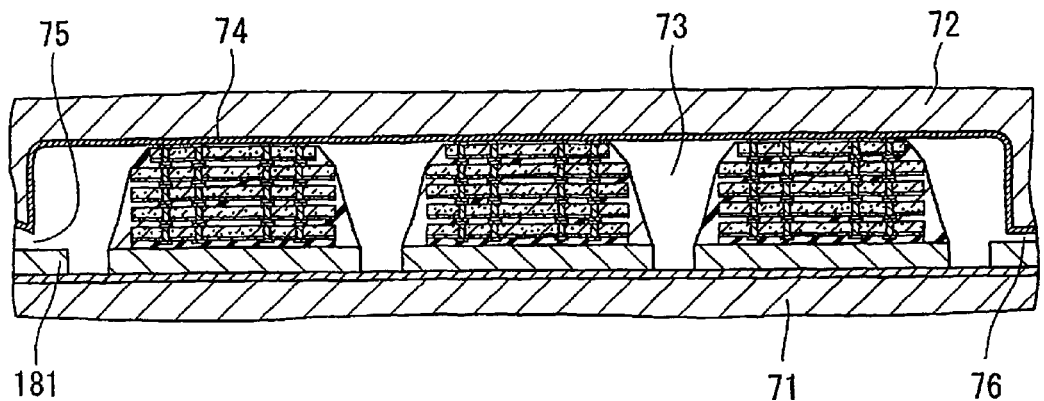
FIG. 9 is a cross sectional elevation view illustrating the semiconductor device in a step, subsequent to the step of FIG. 8, involved in a method of forming the semiconductor device of FIGS. 1 and 2.

Subsequently, as shown in FIG. 9, an upper shaping mold 72, hereinafter referred to as upper mold, of the transfer mold apparatus is arranged through a sheet 74 which is formed of an elastic material. A cavity 73 is formed in the upper mold 72. A plurality of chip stacked structures 46 are spaced from each other and arranged on a wiring substrate before cutting 147. The plurality of chip stacked structures 46 may be brought together in a batch in the cavity 73. Further, a gate section 75 which connects the cavity 72 to the outside is provided in the upper mold 72.

Figure 10:
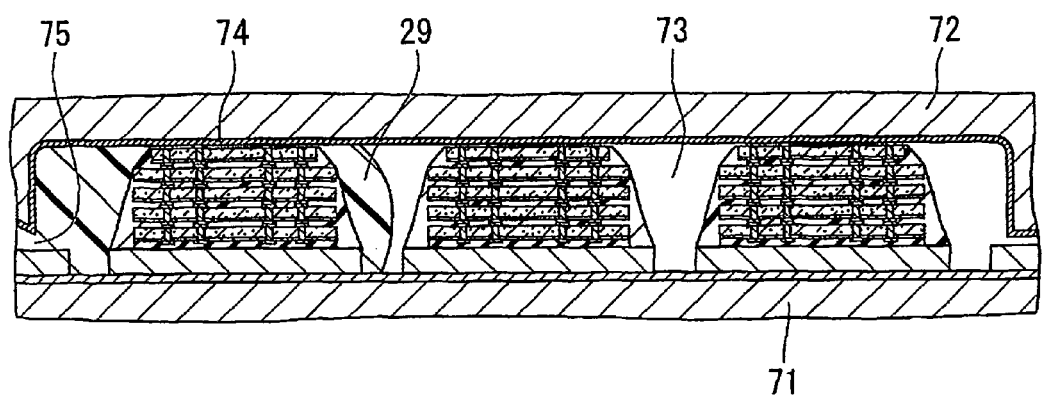
FIG. 10 is a cross sectional elevation view illustrating the semiconductor device in a step, subsequent to the step of FIG. 9, involved in a method of forming the semiconductor device of FIGS. 1 and 2.
Figure 11:
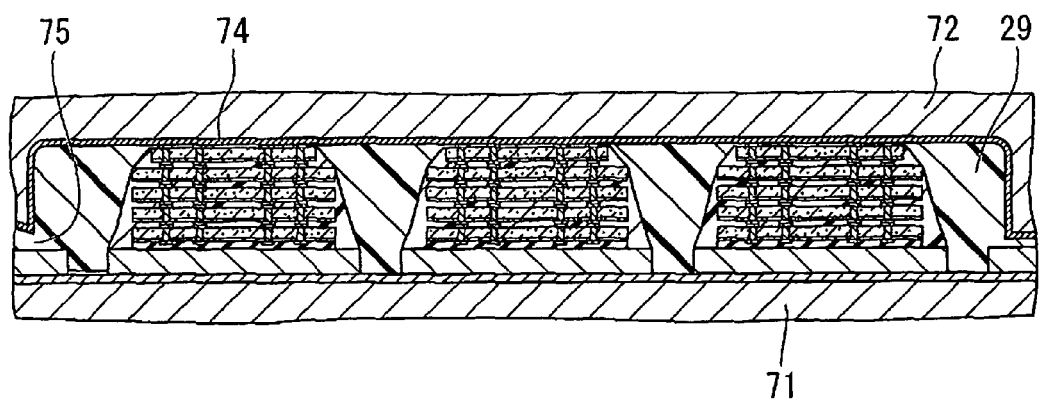
FIG. 11 is a cross sectional elevation view illustrating the semiconductor device in a step, subsequent to the step of FIG. 10, involved in a method of forming the semiconductor device of FIGS. 1 and 2.

As shown in FIG. 10 and FIG. 11, the second sealing member 29 made of a sealing resin is heated and molten inside the cavity 73. The second sealing member 29 is injected through the gate section 75 toward an air vent section 76.

The second sealing member 29 is cured under predetermined conditions. Thermal curing resin such as epoxy resin is used as the sealing resin. Thermal treatment (curing) is performed at about 180° C. Baking is performed at a predetermined temperature, to thereby completely cure the second sealing member 29.

By closing the lower mold 71 and the upper mold 72 through the sheet 74 which is formed of elastic material, the sheet 74 can adhere to one surface side of each chip stacked structure 46. The second sealing member 29 can be prevented from being bent on one surface side of the chip stacked structure 46. Thus, when removing the upper mold 72 and the sheet 74, the lands 30 on one surface side of each chip stacked structure 46 may be exposed.

In this embodiment, the plurality of chip stacked structures 46 is sealed after the periphery of the chip stacked structure 46 is sealed. Voids between the semiconductor chips can be prevented.

In this embodiment, the transfer mold apparatus is used for injection of the second sealing member 29. A compression mold apparatus or compression mold method may be used. By using the compression mold apparatus, the influence of the mold flowing accompanying the injection can be reduced.

The lower mold 71 and the upper mold 72 are removed to obtain the supporting substrate 181 before cutting in which the second sealing member 29 is formed.

Figure 12:
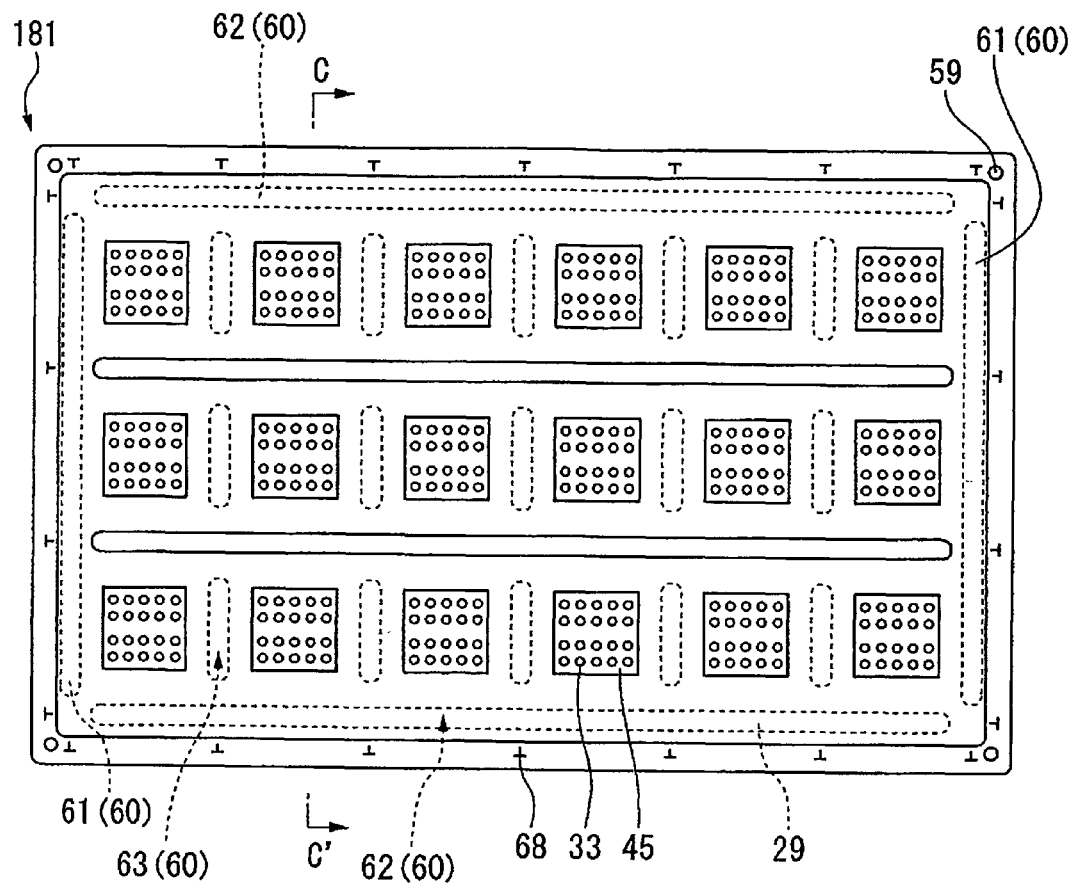
FIG. 12 is a plan view illustrating the semiconductor device in a step, subsequent to the step of FIG. 11, involved in a method of forming the semiconductor device of FIGS. 1 and 2.
Figure 13:
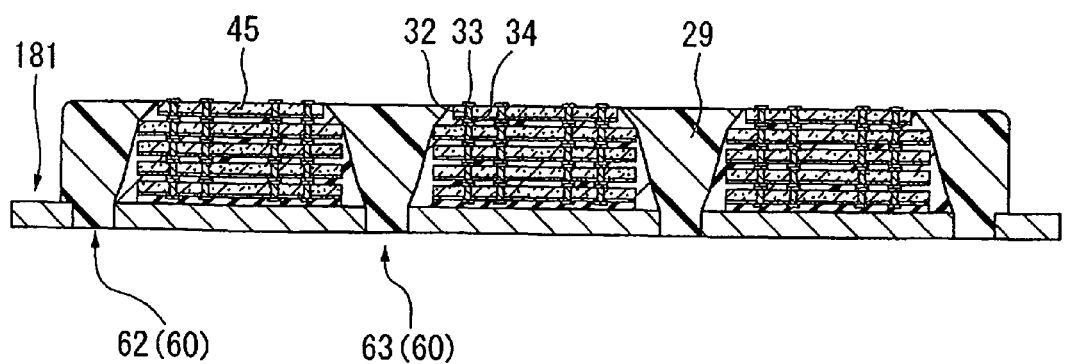
FIG. 13 is a cross sectional elevation view illustrating the semiconductor device, taken along a C-C' line of FIG. 12, in a step, subsequent to the step of FIG. 11, involved in a method of forming the semiconductor device of FIGS. 1 and 2.
Figure 14:
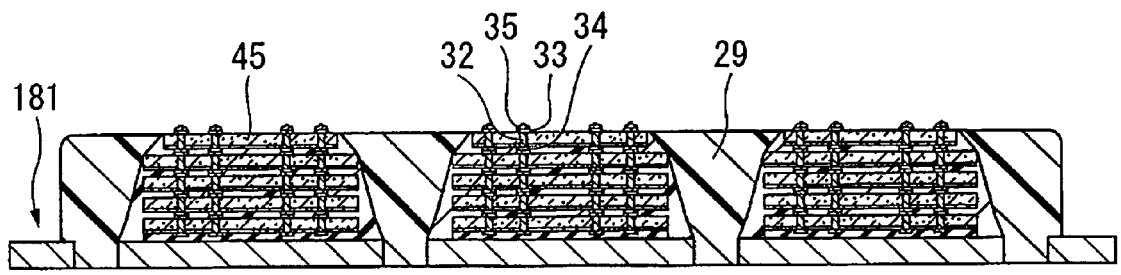
FIG. 14 is a cross sectional elevation view illustrating the semiconductor device, taken along a C-C' line of FIG. 12, in a step, subsequent to the step of FIG. 13, involved in a method of forming the semiconductor device of FIGS. 1 and 2.

FIG. 12 is a plan view of the supporting substrate 181 before cutting in which the second sealing member 29 is formed. FIG. 13 is a sectional view taken along line C-C' in FIG. 12.

As shown in FIGS. 12 and 13, the plurality of chip stacked structures 46 is covered in a batch by the second sealing member 29. The bonding pads 33 of one surface side of the semiconductor chip 45 are exposed.

Wire Bump Forming Process:

A front end of a wire which is made of metal such as Au is melted by a known bonding apparatus not shown to form a ball in the front end thereof. The ball is thermally pressure-bonded with ultrasound waves on the exposed bonding pads 33 on one surface side of the semiconductor chip 45. A rear end of the Au wire is drawn and cut using a wire stand bump method, to thereby form the wire bumps 35 shown in FIG. 14.

The wire bumps 35 may be formed of solder bumps. Alternatively, the bonding pads 33 on one surface side of the semiconductor chip 45 and the bonding pads 34 of the wiring substrate 47 may be directly connected to each other.

Wiring Substrate Mounting Process:

The second adhesive member 27 which is made of NCP is selectively supplied to cover only the exposed surface of the semiconductor chip 45.

Figure 15:
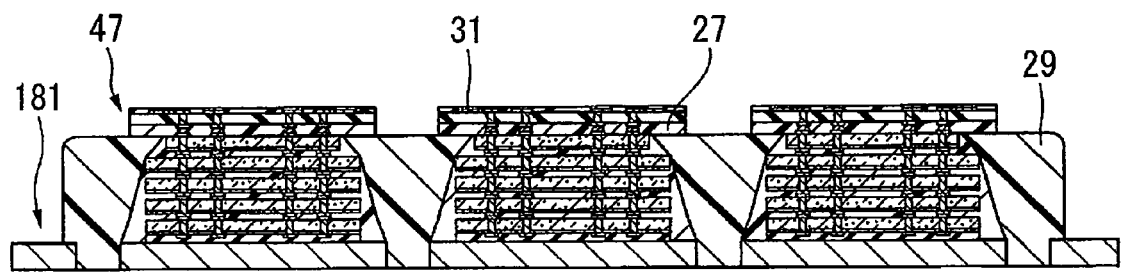
FIG. 15 is a cross sectional elevation view illustrating the semiconductor device, taken along a C-C' line of FIG. 12, in a step, subsequent to the step of FIG. 14, involved in a method of forming the semiconductor device of FIGS. 1 and 2.

As shown in FIG. 15, the wiring substrate 47 is mounted on the semiconductor chip 45 through the second adhesive member 27. The bonding pads 34 of the wiring substrate 47 are electrically connected to the wire bumps 35 of the semiconductor 45 due to thermal pressure-bonding. Then, the second adhesive member 27 is cured to thereby fixedly adhere the wiring substrate 47 onto the chip stacked structure 46.

It is preferable to use a substrate having an area when seen in plan view is smaller than that of the supporting substrate 81 as the wiring substrate 47. Accordingly, when mounting the wiring substrates 47, the risk of the adjacent wiring substrates 47 coming in contact with each other can be substantially eliminated. Further, the risk of the second adhesive member 27 flowing out to the adjacent chip mounting section 65 can be prevented.

Ball Mounting Process:

External terminals 28 which are made of conductive metallic balls such as solder balls are adsorbed and held in a plurality of adsorption holes not shown which is formed in an installation surface of a ball mounting tool not shown of a ball mounter not shown. The adsorption holes are formed to correspond to the arrangement of the plurality of lands 31. An assembly equipment of an existing Ball Grid Array, hereinafter referred to as BGA, may be used as the ball mounter.

Flux is transferred to the external terminals 28 which are made of the solder balls and are adsorbed and held.

Figure 16:
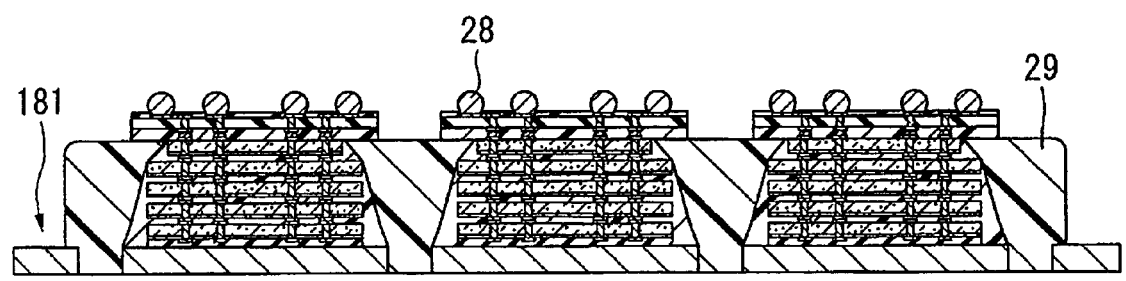
FIG. 16 is a cross sectional elevation view illustrating the semiconductor device, taken along a C-C' line of FIG. 12, in a step, subsequent to the step of FIG. 15, involved in a method of forming the semiconductor device of FIGS. 1 and 2.

As shown in FIG. 16, the external terminals 28 which are made of the solder balls are mounted on the lands 31 which are formed on one surface 47a of the wiring substrate 47. The external terminals 28 are mounted on all the chip stacked structures 46, and then, the supporting substrate 181 before cutting is heated and reflowed to fix the external terminals 28. Thus, the supporting substrate 181 before cutting in which the external terminals 28 are formed is obtained.

In this embodiment, the penetration slits 60 are formed in the supporting substrate 181 before cutting. Bend of the supporting substrate 181 before cutting due to thermal stress of the first sealing member and the second sealing member is reduced. The external terminals 28 which are made of the solder balls can be easily mounted on the lands 31 without deviating from their positions. Accordingly, the processing efficiency in the batch mounting of the external terminals 28 can be enhanced.

Dicing Process:

A dicing tape 79 is attached to the other surface 180b of the supporting substrate 181 before cutting.

Figure 17:
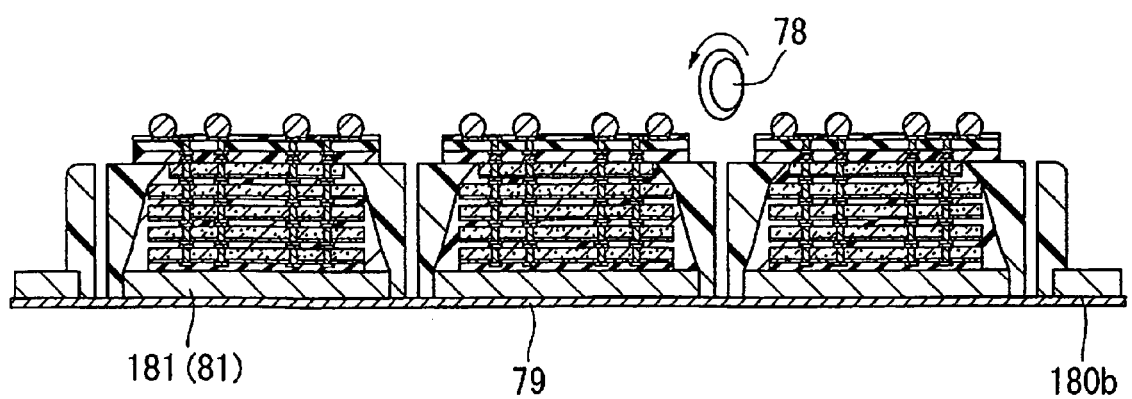
FIG. 17 is a cross sectional elevation view illustrating the semiconductor device, taken along a C-C' line of FIG. 12, in a step, subsequent to the step of FIG. 16, involved in a method of forming the semiconductor device of FIGS. 1 and 2.

As shown in FIG. 17, the supporting substrate 181 before cutting is cut along the cutting marks 68 shown in FIG. 3, by a dicing blade 78 to obtain the supporting substrates 81.

The second sealing member 29 which integrally covers the chip mounting sections 65 is formed on the supporting substrate 181 before cutting. The cutting marks 68 are formed in an outer circumferential part which is not covered with the second sealing member 29. The cutting positions can be correctly recognized. Cutting separation for every chip mounting section 65 can be easily performed. The wiring substrate 47 which is smaller in size than the supporting substrate 81 is used. The supporting substrate 181 before cutting can be cut while the dicing blade 78 is not in contact with the wiring substrate 47. The supporting substrate 181 before cutting having the penetration slits 60 is used. The supporting substrate 181 before cutting can be correctly and easily cut and separated without bend of the supporting substrate 181 before cutting.

The semiconductor device 11 according to an embodiment of the invention is obtained by being picked up from the dicing tape 79.

In this embodiment, the BGA typed semiconductor device has been described. The above-described embodiment may be applied to other semiconductor devices such as LGA (land grid array). In this embodiment, the DRAM core chip and the IF chip are used. The embodiment may be used for a combination of semiconductor chips having different functions such as a memory chip and a logic chip. In this embodiment, the semiconductor chips are stacked to five layers. The number of the stacked layers is not limited thereto.

The method of forming the semiconductor device according to the embodiment forms the first sealing member 26. The first sealing member 26 covers side surfaces 41c to 45c of two or more semiconductor chips 41 to 45. The first sealing member 26 covers parts other than the penetration slits 60 on the supporting substrate 181 before cutting. Expansion on the supporting substrate 181 before cutting of the first sealing member 26 can be restricted. The shape of the first sealing member 26 (underfill shape) can be stabilized.

The method of forming the semiconductor device according to the embodiment forms the second sealing member 29. The second sealing member 29 covers the previously formed first sealing member 26. Then the second sealing member 29 fills the penetration slits 60. The second sealing member 29 can be formed to cover the side end surface 81c of the supporting substrate 81, thereby preventing removal of the supporting substrate 81.

The method of forming the semiconductor device according to the embodiment uses the supporting substrate 181 before cutting having two or more line-shaped penetration slits 60 which are formed to surround the rectangular chip mounting sections 65, when sealing the semiconductor chips 41 to 45 by the first sealing member 26. Thermal stress applied to the semiconductor chips 41 to 45 and the supporting substrate 181 before cutting from the first sealing member 26 can be reduced by the penetration slits 60 of the supporting substrate 181 before cutting on the basis of thermal expansion difference between the semiconductor chips 41 to 45 and the first sealing member 26, to thereby prevent the semiconductor chips from being cracked. Accordingly, multiple connections can become easy and quantity production efficiency can be improved.

In addition, by changing the wiring substrate 47, the terminal arrangement of the semiconductor device can be easily changed.

In the method of forming the semiconductor device according to the embodiment, since the cutting is performed by the penetration slits 60, the cutting and separation can be performed correctly and easily without bend of the supporting substrate 181 before cutting.

The semiconductor device 11 according to the embodiment includes the supporting substrate 81 and the chip stacked structure 46 which is formed by stacking two or more semiconductor chips 41 to 45 which are stacked on one surface of the supporting substrate 81. The semiconductor device 11 also includes the wiring substrate 47 which is stacked on the surface of the chip stacked structure 46 which is opposite to the supporting substrate 81. The semiconductor device 11 also includes the first sealing member 26 which covers the side surface of the chip stacked structure 46. The semiconductor device 11 also includes the second sealing member 29 which covers the first sealing member 26. The semiconductor device 11 also includes the external terminals 28 which are formed on the surface of the wiring substrate 47 which is opposite to the chip stacked structure 46. At least part of the outermost edge section 26f of the first sealing member 26 overlaps with an outer edge section 81f of the supporting substrate 81. The side end surface 81c of the supporting substrate 81 is positioned inside the side section surface 29f of the second sealing member 29. At least part of the side end surface 81f of the supporting substrate 81 is covered by the second sealing member 29. Cracks of the semiconductor chips 41 to 45 can be prevented. Removal of the supporting substrate 81 can be also prevented.

In the semiconductor device 11 according to the embodiment, the semiconductor chips 41 to 45 each include the penetration electrodes 32 which penetrate from one surface side to the other surface side. The semiconductor chips 41 to 45 each include the bonding pads 33 of one surface side and the bonding pads 34 of the other surface side which are connected to the penetration electrodes 32. The bonding pads 33 of the one surface side and the bonding pads 34 of the other surface side are connected to each other and stacked between the respective semiconductor chips. Conduction can be secured from the bonding pads 34 of the other surface side of the semiconductor chip 41 to the bonding pads 33 of one surface side of the semiconductor chip 45. With the flip chip junction, stress applied to the external terminals 28 can be reduced. The reliability of the secondary mounting of the semiconductor device 11 can be enhanced. Thus, a high capacity small semiconductor device having good electric characteristics can be manufactured.

The supporting substrate 181 before cutting according to the embodiment includes the rectangular substrate main body 180. The supporting substrate 181 before cutting also includes the rectangular chip mounting sections 65 which are formed in the surface of the substrate main body 180 and on which the semiconductor chips 41 to 45 are mounted. The supporting substrate 181 before cutting also includes the two or more line-shaped penetration slits 60 which are formed to surround the chip mounting sections 65. The penetration slits 60 include the first penetration slits 61 which are formed along one side and the opposite side of the substrate main body 180. The penetration slits 60 also include the second penetration slits 62 which are formed in the region which is disposed between the first penetration slits 61. The penetration slits 60 also include the third penetration slits 63 which are formed in the region which is disposed between the second penetration slits 62. When sealing the semiconductor chips 41 to 45 by the first sealing member 26, thermal stress is applied to the semiconductor chips 41 to 45 and the supporting substrate 181 before cutting from the first sealing member 26. The thermal stress can be reduced by the penetration slits 60 of the supporting substrate 181 before cutting on the basis of thermal expansion difference between the semiconductor chips 41 to 45 and the first sealing member 26, to thereby prevent the semiconductor chips from being cracked. Bend of the supporting substrate 181 before cutting due to thermal stress can be reduced. The supporting substrate 181 before cutting can be correctly and easily cut and separated.

In addition, when sealing the side surfaces 41c to 45c of the semiconductor chips 41 to 45 by the first sealing member 26, the penetration slits 60 can restrict expansion of the first sealing member 26 like a dam, thereby stabilizing the underfill shape of the first sealing member 26. Accordingly, voids between the semiconductor chips 41 to 45 can be reduced. The reliability of the semiconductor device can be improved.

Second Embodiment

Supporting Substrate Before Cutting:

An example of a supporting substrate before cutting according to a second embodiment of the invention will be described.

Figure 18:
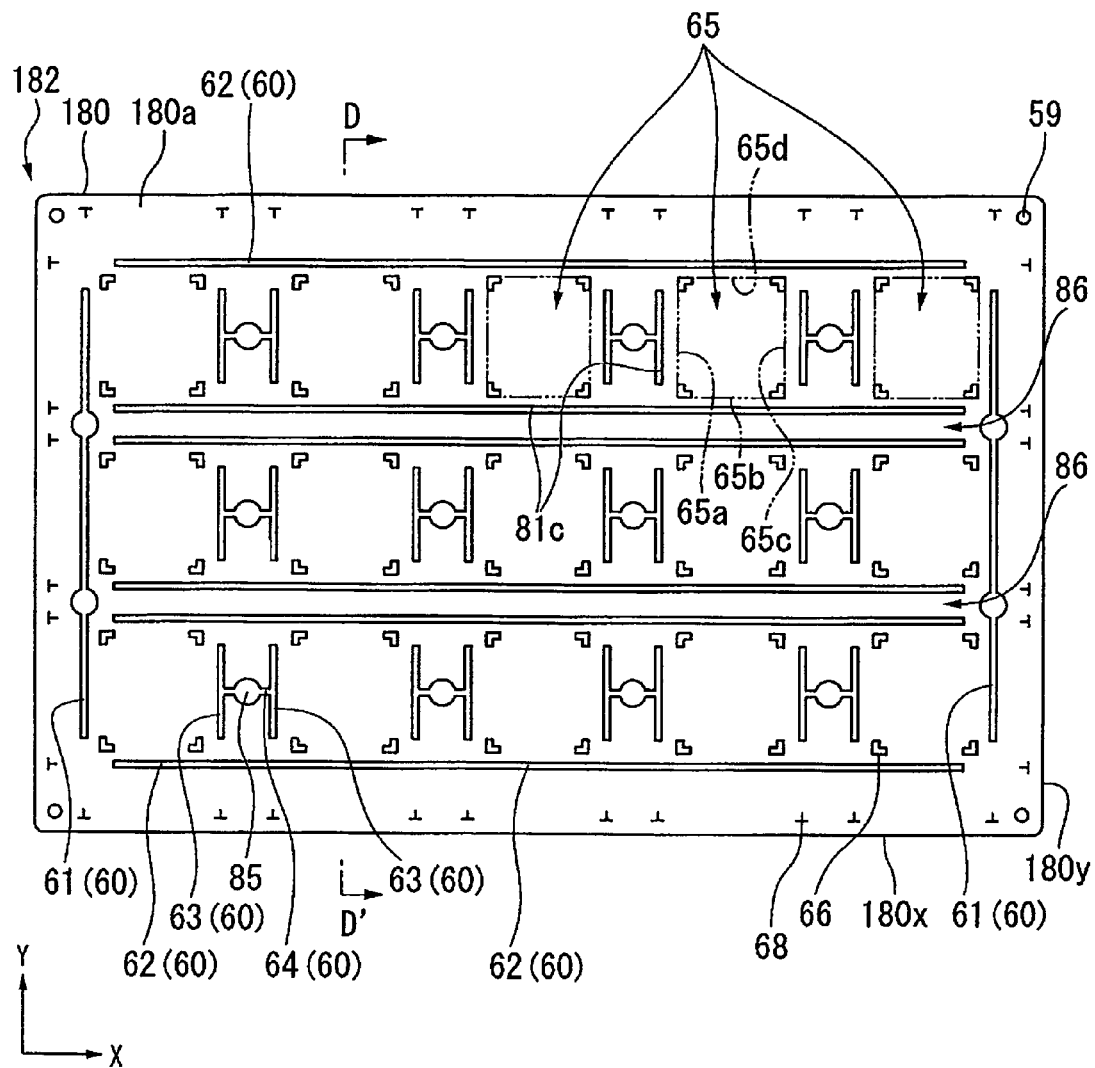
FIG. 18 is a plan view illustrating a supporting substrate before cutting which is used in a method of forming the semiconductor device in a second embodiment of the present invention.
Figure 19:
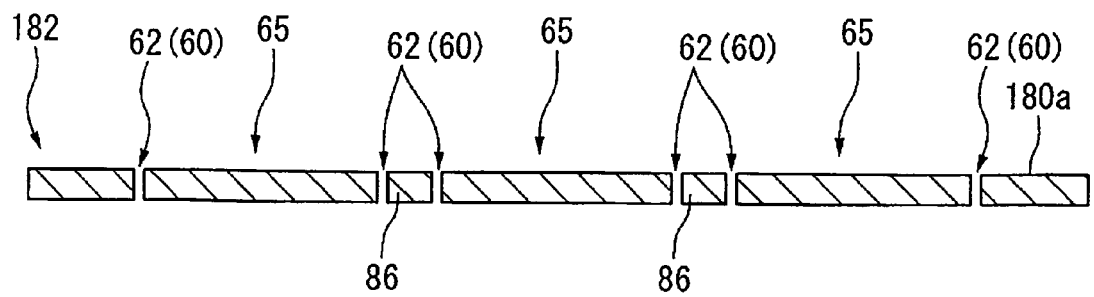
FIG. 19 is a cross sectional elevation view illustrating the supporting substrate before cutting, taken along a D-D' line of FIG. 18, in a step involved in a method of forming the semiconductor device.

FIG. 18 is a plan view illustrating an example of the supporting substrate before cutting according to the second embodiment of the invention. FIG. 19 is a sectional view taken along line D-D' in FIG. 18.

As shown in FIG. 18, a supporting substrate 182 before cutting according to the embodiment has the same configuration as in the supporting substrate 181 before cutting as described in the first embodiment, other than the different arrangement and shape of the penetration slits 60. The same reference numbers are given to the same elements as in the first embodiment.

As shown in FIG. 18, the widths of first penetration slits 61, second penetration slits 62 and third penetration slits 63 of the supporting substrate 182 before cutting according to the present embodiment are smaller than those in the first embodiment.

Each of the first penetration slits 61 has circular penetration holes of which the slit width is partially large in a position corresponding to any one corner of the chip mounting sections 65. Further, two second penetration slits 62 are arranged in parallel with each other between the chip mounting sections 65 which are adjacent to each other in the Y direction. A region 86 where the semiconductor chips are not mounted is secured.

In addition, two third penetration slits 63 are arranged in parallel with each other between the chip mounting sections 65 which are adjacent to each other in the X direction. A fourth penetration slit 64 is formed to connect the two third penetration slits 63. The slit width of a center part of the fourth penetration slit 64 partially becomes large to form a circular penetration hole 85.

The supporting substrate 182 before cutting is cut along the penetration slits 60 to obtain the supporting substrate 81.

Method of Forming Semiconductor Device:

A method of forming a semiconductor device according to an embodiment of the invention will be described.

The method of forming the semiconductor device according to the embodiment includes the following processes. Semiconductor chips are stacked to form a chip stacked structure. The chip stacked structure is mounted on the supporting substrate 182 before cutting. This process will be hereinafter referred to as stacking process. A first sealing member is formed to cover a side surface of the chip stacked structure. Then, a second sealing member is formed to cover the first sealing member, hereinafter referred to as sealing processes.

Stacking Process:

A jig 87 is prepared, which has has a plurality of groove sections 87d which are formed with the same layout as the chip mounting sections 65 of the supporting substrate 182 before cutting. The size of the groove sections 87d corresponds to such a size that the semiconductor chips 41 is inserted therein. Exhaust air holes 87c are formed in a lower surface of the groove sections 87d.

Figure 20:
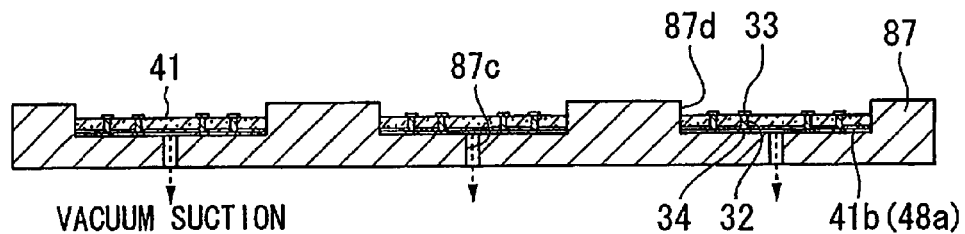
FIG. 20 is a cross sectional elevation view illustrating the semiconductor device in a step involved in a method of forming the semiconductor device in a second embodiment of the present invention.

As shown in FIG. 20, a circuit forming surface 48a is faced down so that the circuit forming surface 48a is directed to the lower surface side of the groove sections 87d. The semiconductor chip 41 is disposed inside the groove section 87d. The semiconductor chip 41 is made of a DRAM core chip includes penetration electrodes 32. Bonding pads 33 and 34 are formed on opposite sides of the penetration electrodes 32.

Then, a vacuum pump not shown which is connected to each discharge hole 87c is operated to adsorb the semiconductor chip 41 on the lower surface side of the groove section 87d. The semiconductor chip 41 is fixedly held inside the groove section 87d.

A circuit forming surface 48a of a semiconductor chip 42 of the DRAM core chip is in the face down direction. The semiconductor chip 42 is mounted on the semiconductor chip 41. At this time, the bonding pads 33 of one surface side of the semiconductor chip 41 and the bonding pads 34 of the other surface side of the semiconductor chip 42 are connected to each other. Both are actually pressure-bonded at a high temperature of about 300° C. while load is applied thereto.

A circuit forming surface 48a of a semiconductor chip 43 of the DRAM core chip is faced down. The semiconductor chip 43 is mounted on the semiconductor chip 42. At this time, the bonding pads 33 of one surface side of the semiconductor chip 42 and the bonding pads 34 of the other surface side of the semiconductor chip 43 are connected to each other. Both are actually pressure-bonded at a high temperature of about 300° C. while load is applied thereto.

A circuit forming surface 48a of a semiconductor chip 44 of the DRAM core chip is in the face down direction. The semiconductor chip 44 is mounted on the semiconductor chip 43. At this time, the bonding pads 33 of one surface side of the semiconductor chip 43 and the bonding pads 34 of the other surface side of the semiconductor chip 44 are connected to each other. Both are actually pressure-bonded at a high temperature of about 300° C. while load is applied thereto.

A circuit forming surface 48a of a semiconductor chip 45 of the IF chip is faced down. The semiconductor chip 45 is mounted on the semiconductor chip 44. At this time, the bonding pads 33 of one surface side of the semiconductor chip 44 and the bonding pads 34 of the other surface side of the semiconductor chip 45 are connected to each other. Both are actually pressure-bonded at a high temperature of about 300° C. while applying load thereto.

Figure 21:
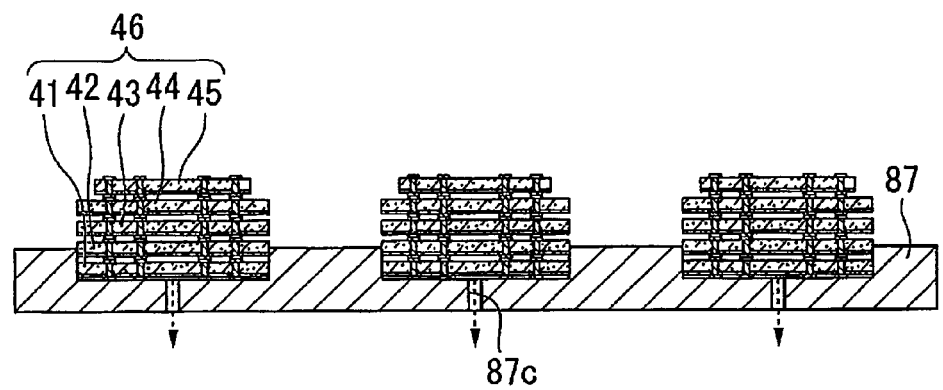
FIG. 21 is a cross sectional elevation view illustrating the semiconductor device in a step subsequent to the step of FIG. 20, involved in a method of forming the semiconductor device.

Accordingly, as shown in FIG. 21, the chip stacked structure 46 is formed by stacking the semiconductor chips 41 to 45 which are electrically connected by the bonding pads 33 and 34 and the penetration electrodes 32.

A first adhesive member 24 such as DAF or NCP is fixedly adhered onto the chip mounting sections 65 of the supporting substrate 182 before cutting.

Figure 22:
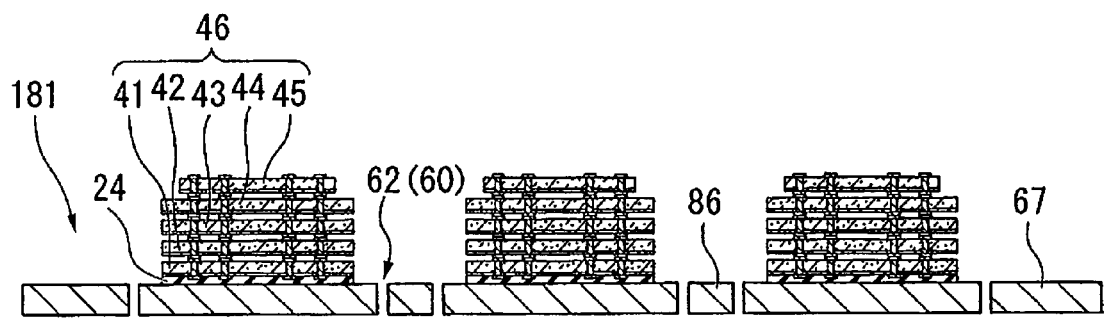
FIG. 22 is a cross sectional elevation view illustrating the semiconductor device in a step subsequent to the step of FIG. 21, involved in a method of forming the semiconductor device.

As shown in FIG. 22, the chip stacked structures 46 which are separated from the jig 87 are mounted in a batch on the chip mounting sections 65 of the supporting substrate 182 before cutting through the first adhesive member 24. Thus, the manufacturing efficiency of the semiconductor device can be enhanced.

Sealing Process:

The first sealing member 26 is supplied in a drop-down manner to the side surface of each chip stacked structure 46 which is formed on the supporting substrate 182 before cutting. At this time, the first sealing member 26 is filled in gaps between the semiconductor chips 41 to 45 due to a capillary tube phenomenon and flows down toward the supporting substrate 182 before cutting due to gravity.

Figure 23:
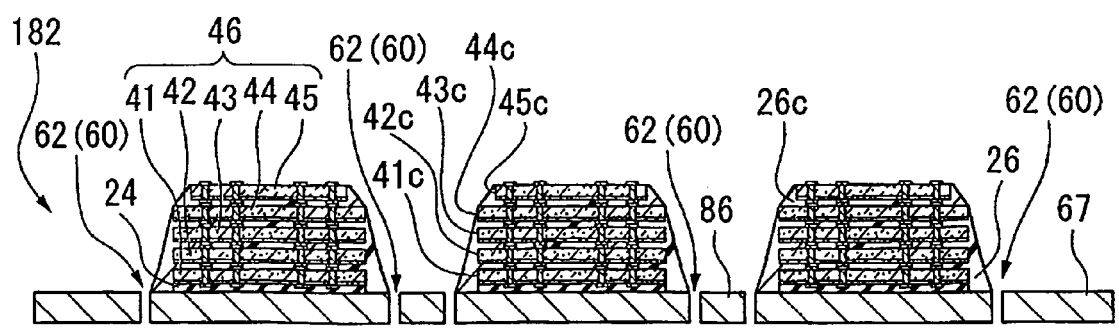
FIG. 23 is a cross sectional elevation view illustrating the semiconductor device in a step subsequent to the step of FIG. 22, involved in a method of forming the semiconductor device.

As shown in FIG. 23, the first sealing member 26 is cured by performing a thermal process (curing) at about 150° C. Thus, the first sealing member 26 is formed which covers side surfaces 41c to 45c of the semiconductor chips 41 to 45. The first sealing member 26 has a trapezoidal shape in vertical sectioned view. The supporting substrate 182 before cutting is the base. The side surface 26c of the first sealing member 26 is an inclined surface.

The second penetration slits 62 are formed in the vicinity of the chip mounting sections 65 of the supporting substrate 182 before cutting. Expansion of the first sealing member 26 is prevented. A fillet shape of the first sealing member 26 which is formed around the chip stacked structures 46 is stabilized.

The second penetration slits 62 are formed in the vicinity of the chip mounting sections 65 of the supporting substrate 182 before cutting. Thermal stress applied to the semiconductor chips 41 to 45 from the first sealing member 26 can be reduced.

Using the same process as in the first embodiment, a second sealing member 29 is formed. The second sealing member 29 covers the plurality of chip stacked structures 46 in a batch by means of a transistor mold device not shown.

Figure 24:
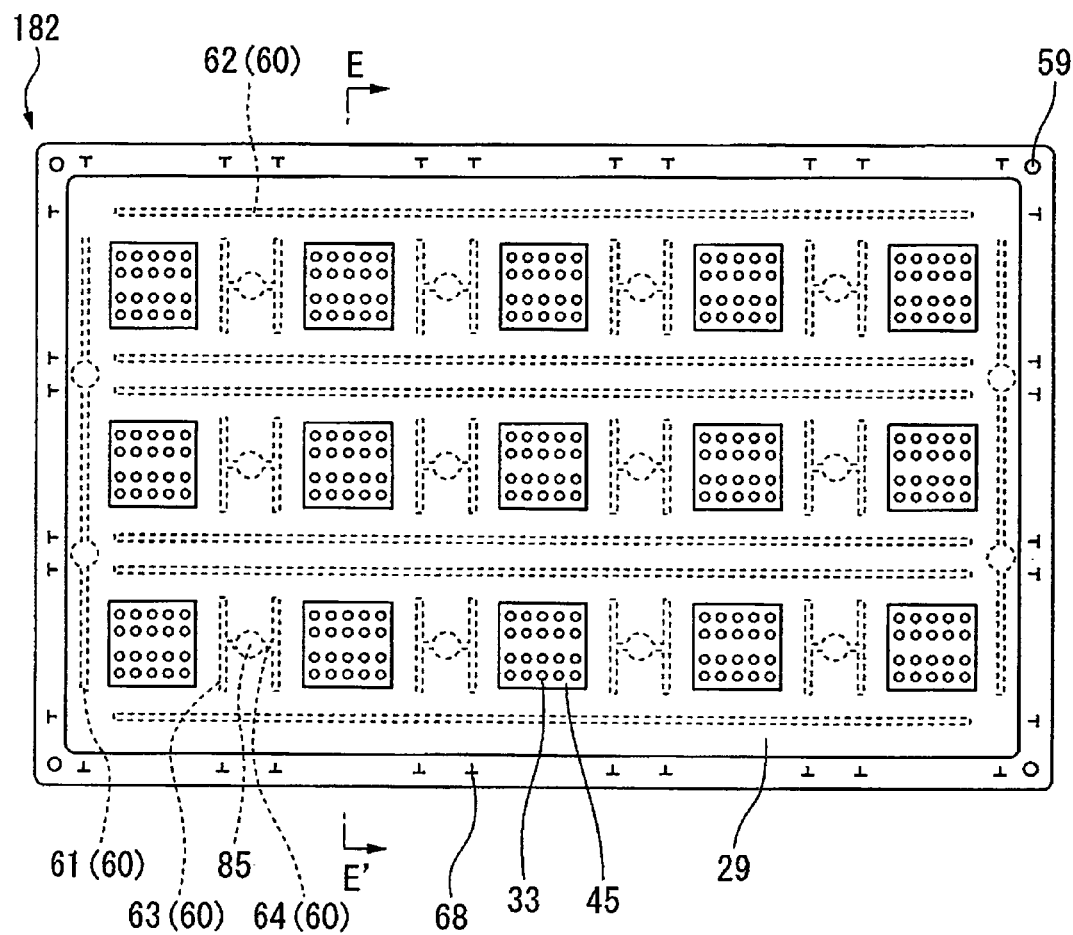
FIG. 24 is a plan view illustrating a supporting substrate before cutting which is used in a method of forming the semiconductor device in a second embodiment of the present invention.
Figure 25:
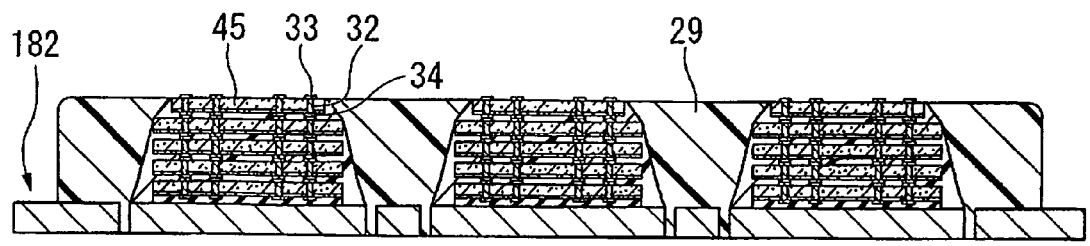
FIG. 25 is a cross sectional elevation view illustrating the semiconductor substrate before cutting, taken along an E-E' line of FIG. 24, in a step subsequent to the step of FIG. 23, involved in a method of forming the semiconductor device.

FIG. 24 is a plan view of the supporting substrate 182 before cutting in which the second sealing member 29 is formed. FIG. 25 is a sectional view taken along line E-E' in FIG. 24.

As shown in FIGS. 24 and 25, the plurality of chip stacked structures 46 which is covered with the first sealing member 26 is covered by the second sealing member 29 in a batch. Further, the bonding pads 33 of one surface side of the semiconductor chip 45 are exposed.

Figure 26:
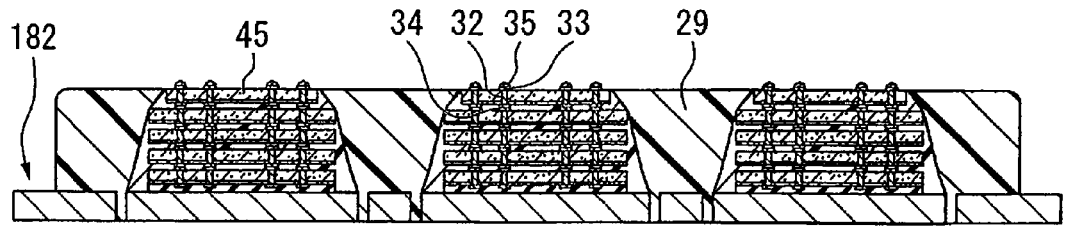
FIG. 26 is a cross sectional elevation view illustrating the semiconductor substrate before cutting, taken along an E-E' line of FIG. 24, in a step subsequent to the step of FIG. 25, involved in a method of forming the semiconductor device.

Wire Bump Forming Process:

A front end of a wire which is made of metal such as Au is melted by a known bonding apparatus not shown to form a ball in the front end thereof. The ball is thermally pressure-bonded with ultrasound waves on the exposed bonding pads 33 on one surface side of the semiconductor chip 45. Then, a rear end of the Au wire is drawn and cut using a wire stand bump method or the like, to thereby form the wire bumps 35 shown in FIG. 26.

The wire bumps 35 may be formed of solder bumps. Alternatively, the bonding pads 33 on one surface side of the semiconductor chip 45 and the bonding pads 34 of the wiring substrate 47 may be directly connected to each other.

Wiring Substrate Mounting Process:

A second adhesive member 27 which is made of NCP is selectively supplied to cover only the exposed surface of the semiconductor 45.

Figure 27:
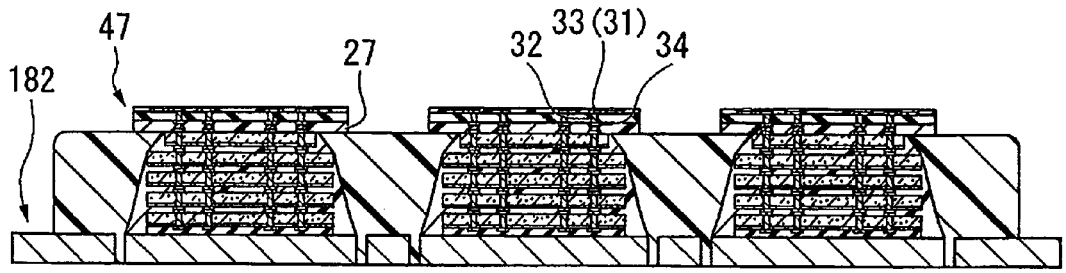
FIG. 27 is a cross sectional elevation view illustrating the semiconductor substrate before cutting, taken along an E-E' line of FIG. 24, in a step subsequent to the step of FIG. 26, involved in a method of forming the semiconductor device.

As shown in FIG. 27, the wiring substrate 47 is mounted on the semiconductor chip 45 through the second adhesive member 27. The bonding pads 34 of the wiring substrate 47 are electrically connected to the wire bumps 35 of the semiconductor chip 45 due to thermal pressure-bonding. Then, the second adhesive member 27 is cured to fixedly adhere the wiring substrate 47 onto the chip stacked structure 46.

It is preferable to use a substrate having an area in plan view smaller than that of the supporting substrate 81 as the wiring substrate 47. Accordingly, when mounting the wiring substrates 47, the risk of the adjacent wiring substrate 47 coming in contact with each other can be substantially eliminated. Further, the risk of the second adhesive member 27 flowing out to the adjacent chip mounting section 65 may be reduced.

Ball Mounting Process:

External terminals 28, which are made of conductive metallic balls such as solder balls, are adsorbed and held in a plurality of adsorption holes not shown. The plurality of adsorption holes is formed in mounting surfaces of a ball mounting tool not shown of a ball mounter not shown. The adsorption holes are formed to correspond to the arrangement of the plurality of lands 31. Further, an assembly equipment of an existing Ball Grid Array (BGA) may be used as the ball mounter.

Flux is transferred to the external terminals 28 which are made of the solder balls and are adsorbed and held.

Figure 28:
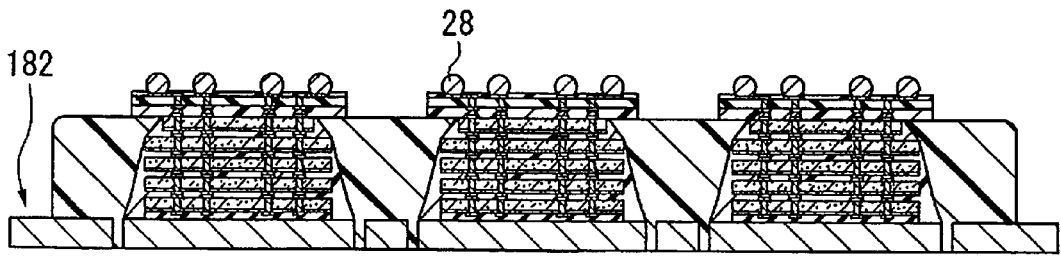
FIG. 28 is a cross sectional elevation view illustrating the semiconductor substrate before cutting, taken along an E-E' line of FIG. 24, in a step subsequent to the step of FIG. 27, involved in a method of forming the semiconductor device.

As shown in FIG. 28, the external terminals 28 which are made of the solder balls are mounted on the lands 31 which are formed on one surface 47a of the wiring substrate 47. The external terminals 28 are mounted on all the chip stacked structures 46. The supporting substrate 182 before cutting is heated and reflowed to fix the external terminals 28. Thus, the supporting substrate 182 before cutting is obtained. The external terminals 28 are formed in the supporting substrate 182.

In this embodiment, the penetration slits 60 are formed in the supporting substrate 182 before cutting. Bend of the supporting substrate 182 before cutting can be further reduced. The external terminals 28 which are made of solder balls can be easily mounted on the lands 31 without displacement from their positions. Accordingly, the processing efficiency in the batch mounting of the external terminals 28 can be enhanced.

Dicing Process:

A dicing tape 79 is attached to the other surface 182b of the supporting substrate 182 before cutting.

Figure 29:
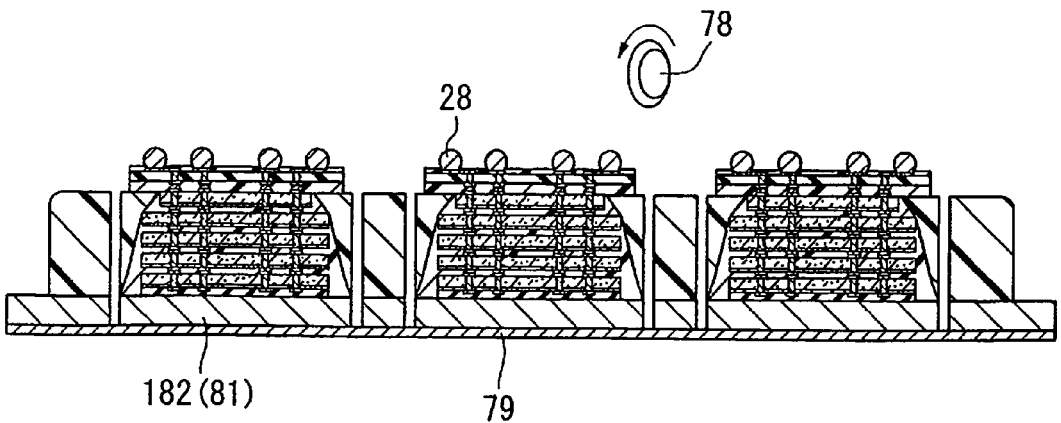
FIG. 29 is a cross sectional elevation view illustrating the semiconductor substrate before cutting, taken along an E-E' line of FIG. 24, in a step subsequent to the step of FIG. 28, involved in a method of forming the semiconductor device.

As shown in FIG. 29, the supporting substrate 182 before cutting is cut along the cutting marks 68 shown in FIG. 18 in a lattice pattern in longitudinal and transverse directions, by a dicing blade 78 to obtain the supporting substrates 81.

The second sealing member 29 which integrally covers the chip mounting sections 65 is formed on the supporting substrate 182 before cutting. The cutting marks 68 are formed in an outer circumferential part which is not covered with the second sealing member 29. The cutting positions can be correctly recognized. The cutting separation for every chip mounting section 65 can be easily performed.

The wiring substrate 47 which is smaller in size than the supporting substrate 81 is used. The supporting substrate 181 before cutting can be cut while the dicing blade 78 is not in contact with the wiring substrate 47.

The semiconductor device 12 according to the embodiment of the invention is obtained by being picked up from the dicing tape 79.

In this embodiment, the supporting substrate 182 before cutting is cut by the penetration slits 60. A region 86 is disposed between the penetration slits 60. On the region 86, the semiconductor chips are not mounted. Thus, the area for the supporting substrate 81 can be enlarged to obtain high thermal radiation characteristics. Adhesion between the supporting substrate 81 and the second sealing member 29 can be enhanced to prevent removal of the supporting substrate 81. Further, compared with the cutting in the penetration slits 60, the risk of package cracks can be reduced when cutting.

The fourth penetration slits 64 are formed to connect the third penetration slits 63 in the supporting substrate 182 before cutting according to the embodiment. Thermal stress can be further reduced, which is applied to the semiconductor chips 41 to 45 and the supporting substrate 182 before cutting from the first sealing member 26.

The portions of which the slit width partially becomes large are formed in the penetration slits 60 in the supporting substrate 182 before cutting according to the embodiment. Thermal stress is applied to the semiconductor chips 41 to 45 and the supporting substrate 182 before cutting from the first sealing member 26. The thermal stress can be further reduced.

The portions of which the slit width partially becomes large are the circular penetration holes 85 in the supporting substrate 182 before cutting according to the embodiment. Thermal stress is applied to the semiconductor chips 41 to 45 and the supporting substrate 182 before cutting from the first sealing member 26. The thermal stress can be further reduced.

The present invention relates to a supporting substrate before cutting, a semiconductor device and a method of forming the semiconductor device, and more particularly, to a supporting substrate before cutting, a semiconductor device and a method of forming the semiconductor device in which cracks of semiconductor chips due to thermal stress are restricted, an underfill shape is stabilized and the removal of the supporting substrate is restricted, and thus, has industrial applicability in the fields of manufacturing and using semiconductor devices.

As used herein, the following directional terms "over, under, up, down, forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a supporting substrate;
   a stack of semiconductor chips mounted over the supporting substrate such that said supporting substrate is electrically insulated from the stack of semiconductor chips;
   a circuit board over the stack of semiconductor chips, the stack of semiconductor chips being disposed between the supporting substrate and the circuit board;
   a first sealing member that seals the stack of semiconductor chips; and a second sealing member that covers the first sealing member, the second sealing member covering a side edge of the supporting substrate, wherein the first sealing member covers the side edges of the semiconductor chips of the stack of semiconductor chips such that a top surface of the first sealing member covering the semiconductor chip side edges forms an inclined surface relative to an outer edge of a top surface of the supporting substrate, said first sealing material thereby forming a fillet shape on said outer edge of the top surface of the supporting substrate adjacent to said side edges of the semiconductor chips.

2. The semiconductor device according to claim 1, wherein the side edge of the circuit board is in plan view positioned inside the side edge of the supporting substrate.

3. The semiconductor device of claim 1, wherein said first sealing material has a high thermal conductivity, so that said fillet provides a heat conduction path from the semiconductor chips to the supporting substrate to thereby improve a thermal radiation characteristic of said semiconductor device.

* * * * *